(12) United States Patent
Lozhkin

(10) Patent No.: US 8,648,655 B2
(45) Date of Patent: Feb. 11, 2014

(54) MODULATOR AND AN AMPLIFIER USING THE SAME

(75) Inventor: Alexander N. Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 48 days.

(21) Appl. No.: 13/529,570

(22) Filed: Jun. 21, 2012

(65) Prior Publication Data

US 2013/0049861 A1 Feb. 28, 2013

(30) Foreign Application Priority Data

Aug. 26, 2011 (JP) .................................. 2011-184921

(51) Int. Cl.
*H03F 3/38* (2006.01)

(52) U.S. Cl.
USPC ........................................ 330/10; 330/124 R

(58) Field of Classification Search
USPC ......... 330/10, 295, 124 R; 375/297, 296, 295
See application file for complete search history.

(56) References Cited

U.S. PATENT DOCUMENTS

| | | | |
|---|---|---|---|
| 7,260,157 B2 | 8/2007 | Hagh et al. | |
| 7,260,368 B1 | 8/2007 | Blumer | |
| 7,724,839 B2 * | 5/2010 | Chen et al. | 375/296 |
| 7,738,619 B2 * | 6/2010 | Hasson et al. | 375/376 |
| 7,889,811 B2 * | 2/2011 | Byun et al. | 375/297 |
| 8,059,749 B2 * | 11/2011 | Sorrells et al. | 375/297 |
| 2002/0027958 A1 | 3/2002 | Kolanek | |
| 2010/0074367 A1 | 3/2010 | Kim et al. | |

FOREIGN PATENT DOCUMENTS

| | | |
|---|---|---|
| JP | 2004-260707 | 9/2004 |
| JP | 2009-171460 | 7/2009 |

OTHER PUBLICATIONS

J. H. Qureshi et al., "A 90-W Peak Power GaN Outphasing Amplifier With Optimum Input Signal Conditioning," IEEE Trans on Microwave Theory and Techniques, 2009, vol. 57, No. 8, pp. 1925-1935.
Ilkka Hakala et al., "A 2.14-GHz Chireix Outphasing Transmitter," IEEE Trans on Microwave Theory and Techniques, Jun. 2005, vol. 53, No. 6, pp. 2129-2138.
W. C. Edmund Neo et al., "A Mixed Signal Approach Towards Linear and Efficient N-Way Doherty Amplifiers," IEEE Trans on Microwave Theory and Techniques, May 2007, vol. 55, No. 5, pp. 866-879.
Paloma Garcia, et al., "Adaptive digital correction of gain and phase imbalances in LINC transmitters," IEEE Trans, 2004, vol. 3, pp. 2137-2141.

* cited by examiner

*Primary Examiner* — Henry Choe
(74) *Attorney, Agent, or Firm* — Fujitsu Patent Center

(57) ABSTRACT

A linear amplification with nonlinear components (LINC) modulator is provided. The LINC modulator includes: a separator that generates a plurality of constant envelope signals from a source signal; a processor that receives an input signal and detects and removes a phase jump in phase trajectory of the input signal to generate a first signal having a continuous phase trajectory and a second signal having a discontinuous phase trajectory; and a quadrature modulator that mixes the first signal with the second signal to reconstruct the input signal.

12 Claims, 25 Drawing Sheets

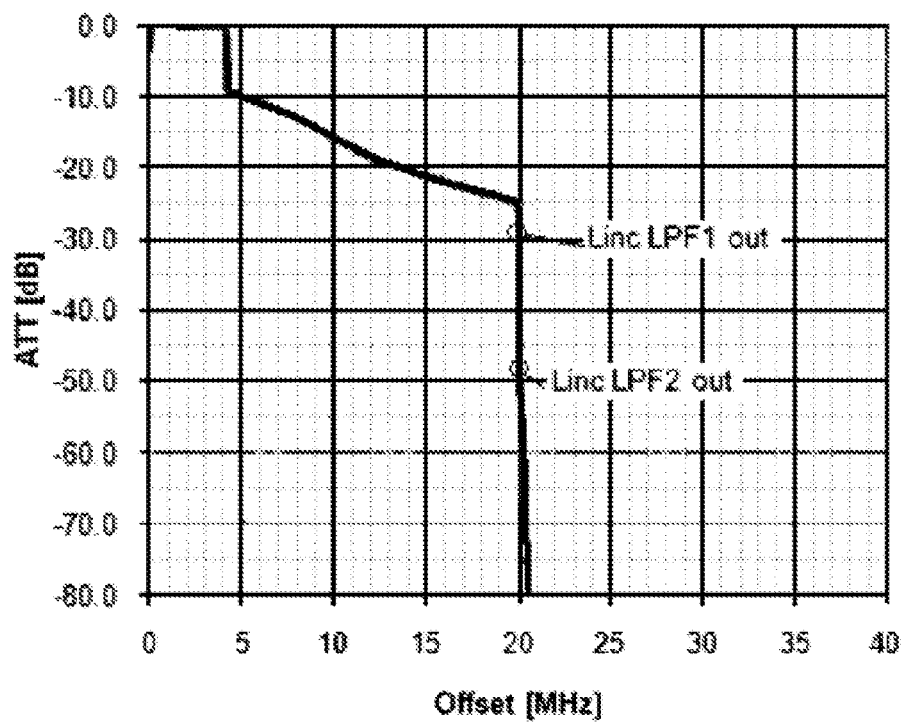
F I G. 4

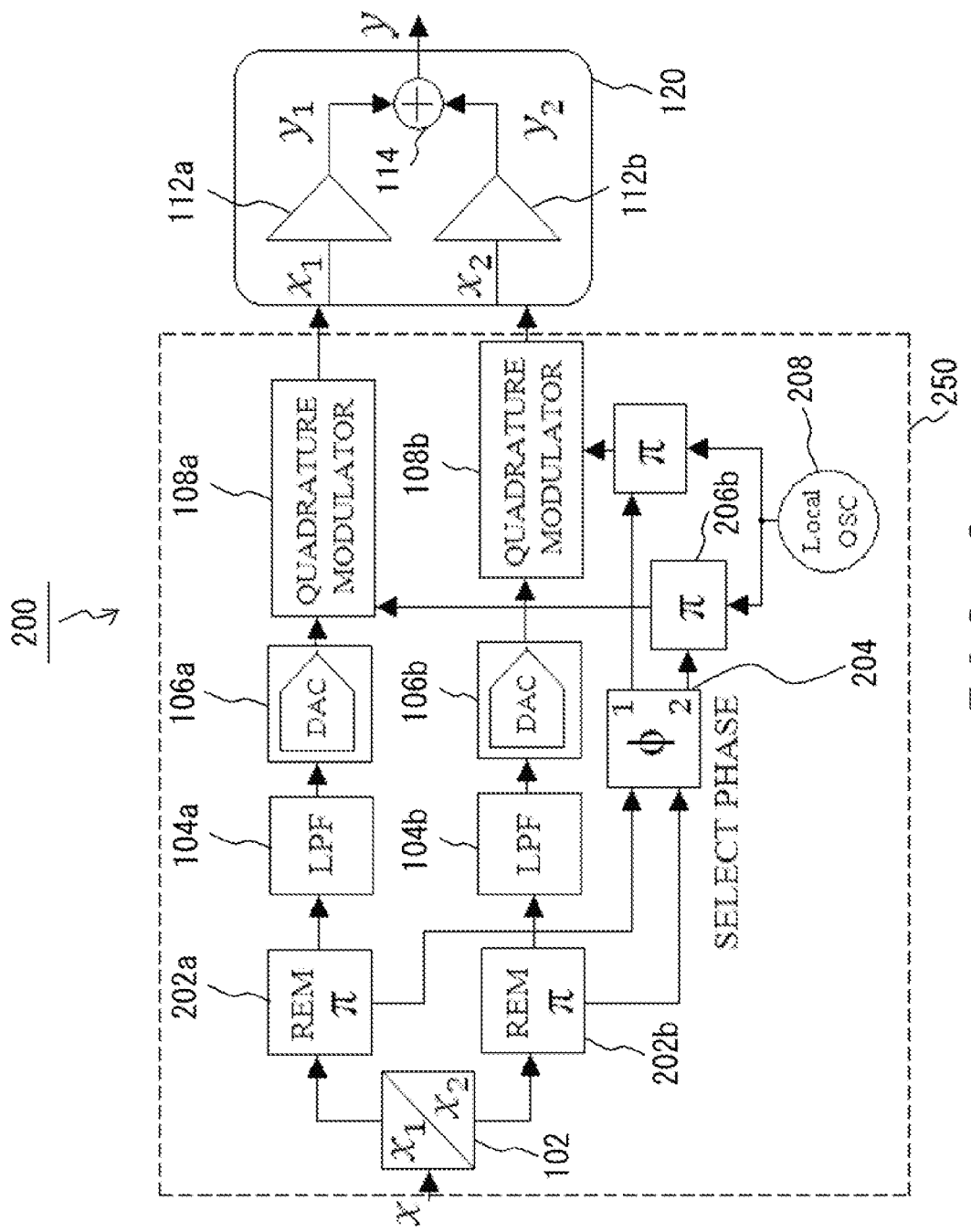
F I G. 6

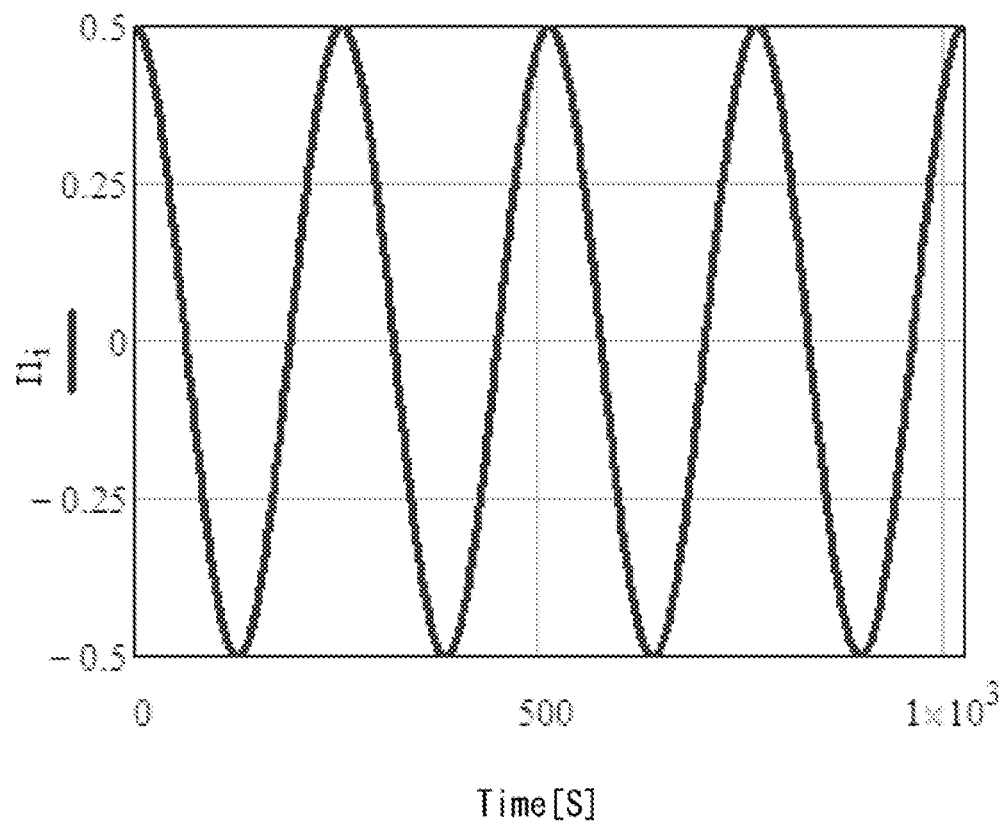
F I G. 10

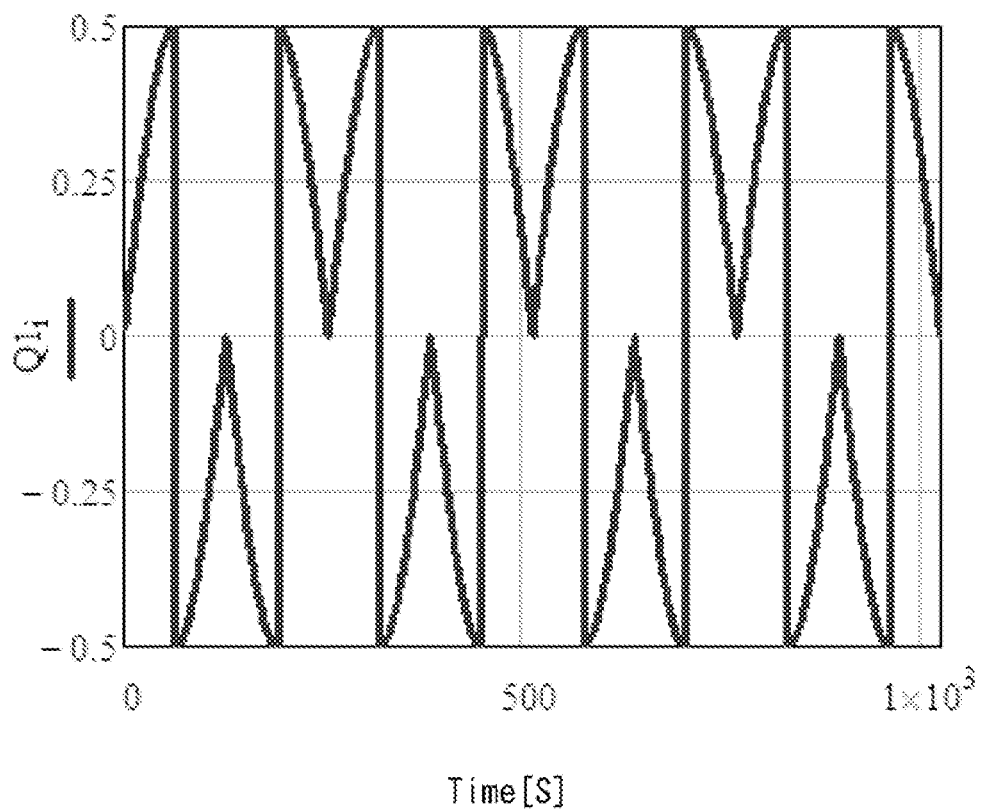
F I G. 1 1

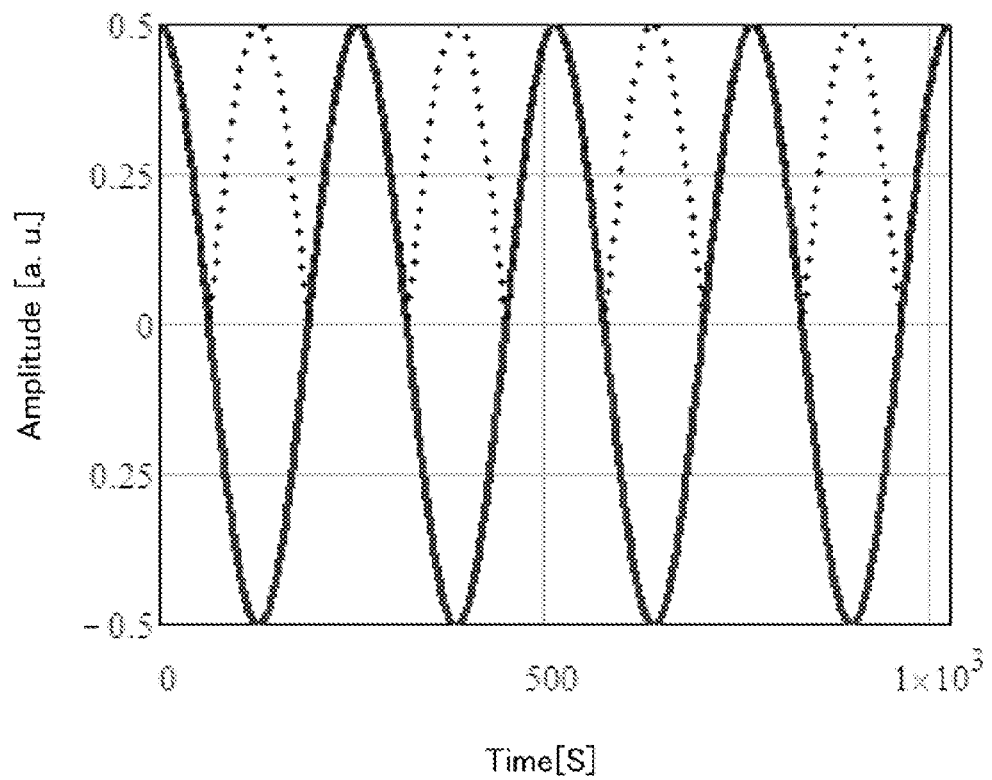
F I G. 14

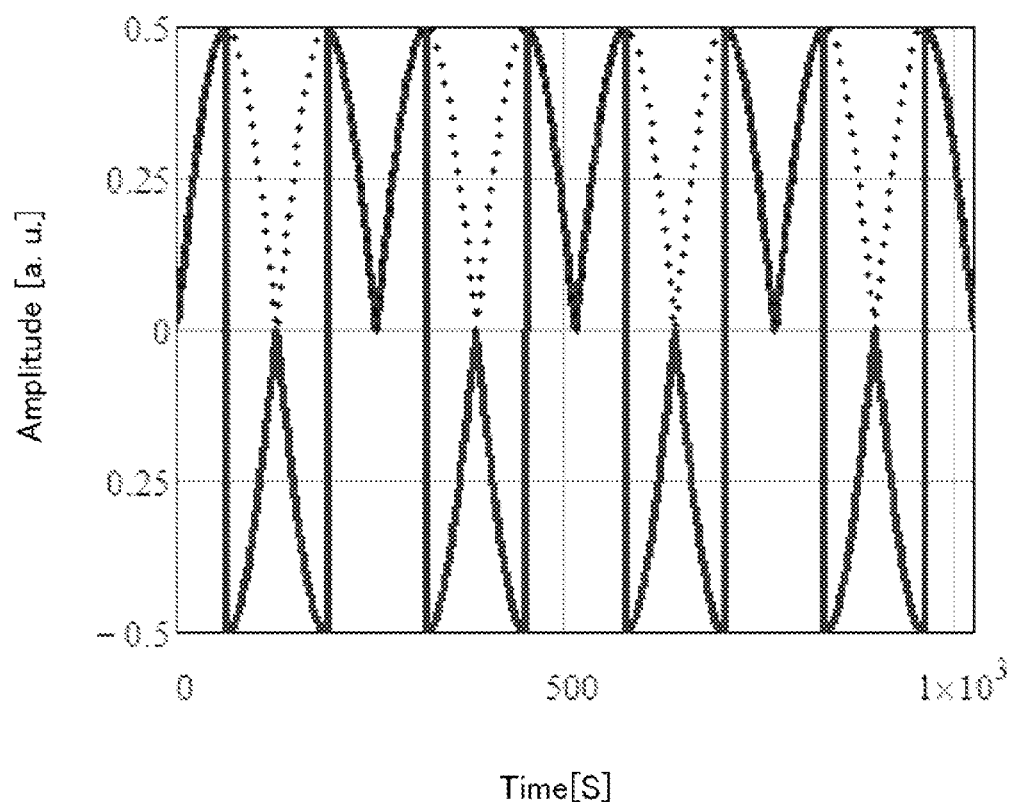
F I G. 15

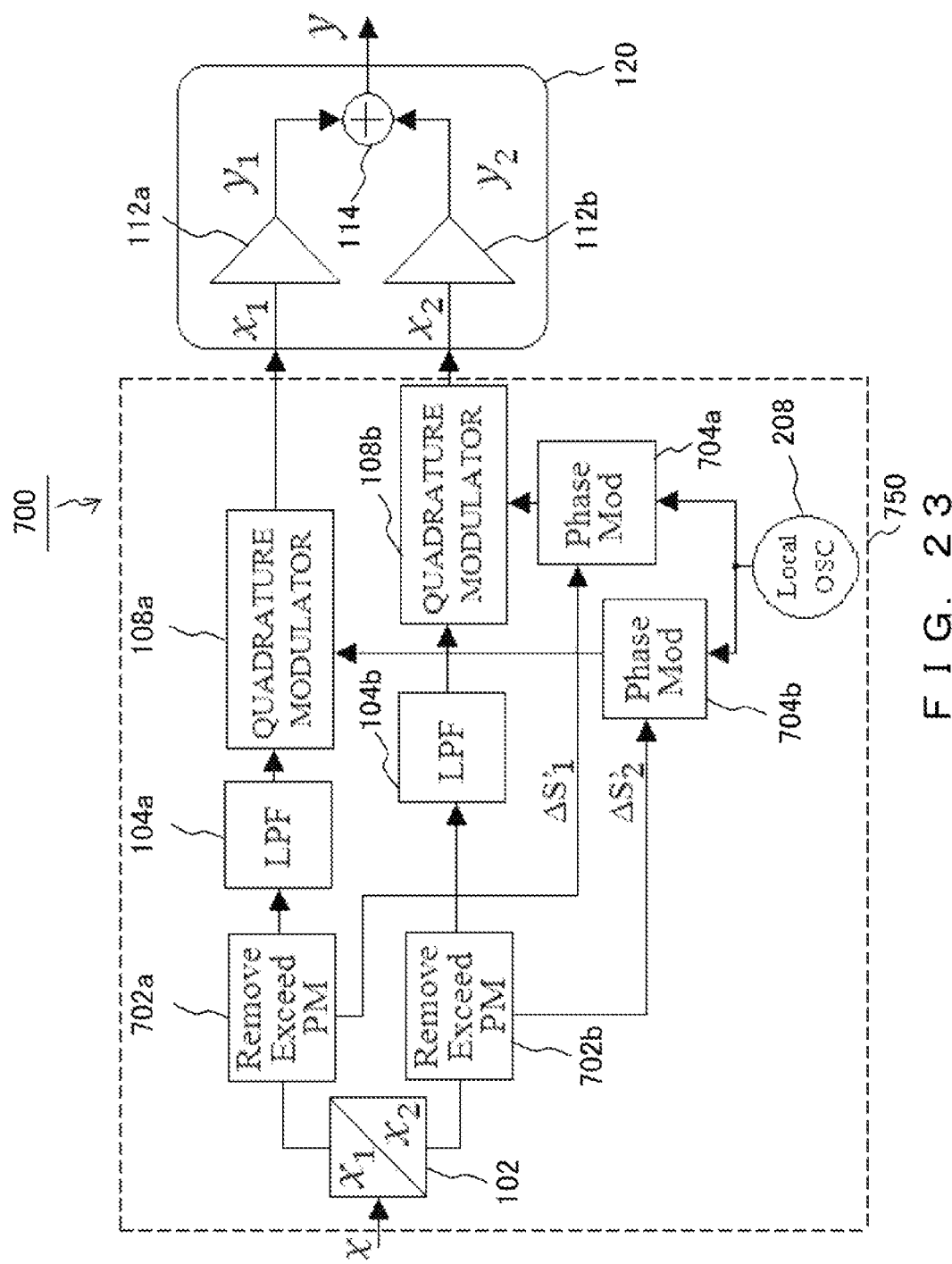
F I G. 23

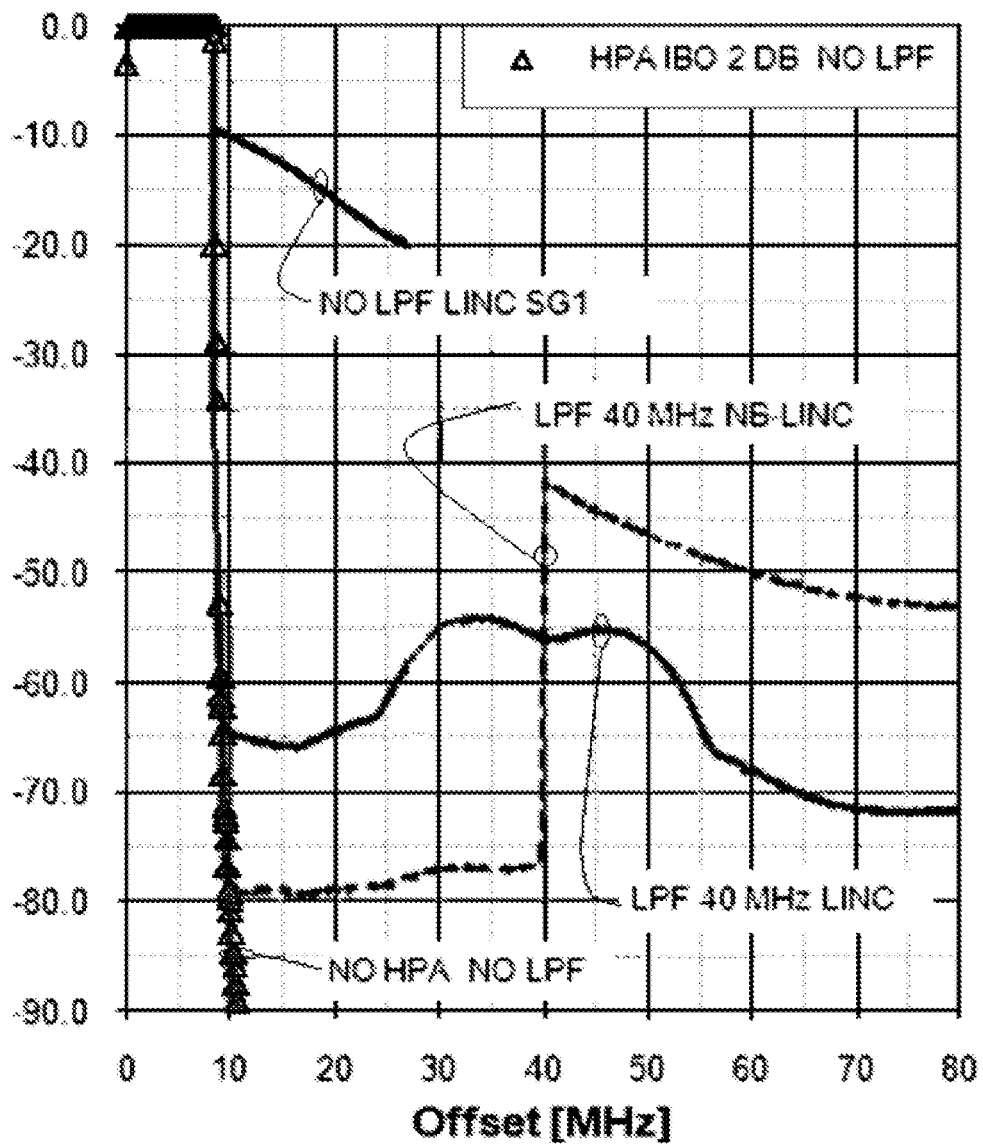
F I G. 2 4

MODULATOR AND AN AMPLIFIER USING THE SAME

CROSS-REFERENCE TO RELATED APPLICATIONS

This application is based upon and claims the benefit of priority of the prior Japanese Patent Application No. 2011-184921 filed on Aug. 26, 2011, the entire contents of which are incorporated herein by reference.

FIELD

This invention relates to a modulator and a high power amplifier using the same.

BACKGROUND

There is a high interest in wireless communication to develop highly linear and efficient power amplifier suitable for third generation (3G) and upcoming fourth generation (4G) of communication standards. These new standards have potential for offering more and better data services. However, in order to establish this within a restricted frequency band, it is needed to use signals with high peak-to-average power ratios (e.g., wideband code vision multiple access (WCDMA) ~10 dB), requiring high linearity of the transmitting amplifier. Hence, in general, power amplifiers are designed to be subjected to the peak-power condition, but are operated most of the time at sufficiently lower power levels (power peak-off). As a result, the power amplifier operating with these signals may function such that the peak efficiency is high, but the average amplifier efficiency is rather low.

For this reason, there is a renewed interest in high efficiency power amplifiers, for example the Doherty power amplifier (DPA), linear amplification using nonlinear components (LINC), envelope tracking (ET) and the like. These types of the amplifiers are currently investigated as potential candidates suitable for the current and above-mentioned upcoming communication standards. In such the radio frequency (RF) amplifier demands more high efficiency and high linearity than general RF amplifier. Specifically, due to its improved efficiency, low complexity, and low cost, the two-way DPA has already penetrated the market. The DPA is, in general, high efficiency than general balanced amplifier. Although a general designs focus only amplitude distortions and phase distortions, a memory effect and linearity become very important factors recently. The general structure of the DPA has a weak point which leads high distortion such as third and fifth inter-modulation distortions (IMDs). For example, such the distortion results from a sudden variation of impedance at signal synthesized point. To reduce the distortion by structure of the DPA, it demands complex compensator. The memory effect includes electric memory effect and electrothermal memory effect. The electric memory effect is occurred by bias and matching circuit's impedance variation in base and harmonic band. The electrothermal memory effect is FET power amplifier's gain variation by device temperature. The electrothermal memory effect is inevitable factor.

Therefore, proper compensator structures, such as the composite high power amplifier (C-HPA) have been introduced to increase the efficiency and output power. Such C-HPA comprises from several individual high power amplifier (HPA). Most common configuration is C-HPA with two HPAs which also known as a linear amplification using nonlinear components (LINC).

The LINC technique was first proposed in 1974 as a method of achieving linear amplification at microwave frequencies. The basic scheme of LINC for amplifier has two RF HPAs that are assumed to be high-efficiency and highly nonlinear. The RF source signal x(t) is split into two constant envelope, phase modulated signals, $x1(t)$, $x2(t)$ by signal component separator (SCS) that has a function of the signal separation or generation process, and each is fed into its own nonlinear RF power amplifier. The HPAs separately increase the power of each signal to generate output signals $y1(t)$ and $y2(t)$ before feeding them into a summing junction for recombination. The resulting output signal from the summing junction is then an amplified version of the original input signal without any distortion, if all components constituting the HPA are ideal ones.

In many issues it is assumed that the bandwidth at the digital-to-analog convertor (DAC) output is unlimited. However for many cases such assumption is not applicable. The real oversampling DAC operating with high clock frequencies may be assumed as such the ideal converter.

Despite the original signal x(t) has a narrow spectrum, the signal component separating (SCS) operation causes a significant spectrum expansion for signals $x1(t)$ and $x2(t)$ in the C-HPA arms. In the conventional technique disclosed in, for example, patent document 1 and non-patent documents 1-4 cited below, it is assumed the ideal arms with unlimited bandwidth (i.e. ultra-wideband ideal DACs) that may pass wideband signals $x1(t)$ and $x2(t)$ without any distortions to inputs to the HPAs (hereinafter, sometimes to be referred to as HPA1 and HPA2). The most critical element in the arm may be DAC because its bandwidth is limited by operating clock. Typically this is 100-150 MHz for low/mid-ends commercial available Large Scale Integrations (LSIs). In contrast, DACs for the broadband applications such as Worldwide interoperability for Microwave Access (WiMAX), Long Term Evaluation (LTE), Wideband Code Division Multiple Access (W-CDMA) and the like, in order to avoid distortions in signals $x1(t)$ and $x2(t)$, must provide very high bandwidth (must operate with high clock frequencies in order several hundred MHz) and at the same time provide a high level of bit resolution (quantization), for example, 800 MHz clock and 14 bit resolution. The cost for such a hi-speed and hi-resolution hi-end DACs is high.

The frequency restrictions caused by component of a high frequency circuit such as LPFs at the DACs inputs (or DAC outputs) result in the parasitic AM at the HPA1 and HPA2 inputs for signals $x1(t)$ and $x2(t)$. The LPFs cut some high frequency part of signals $x1(t)$ and $x2(t)$. The high frequency part that cut by LPF causes the unwanted parasitic AM modulation in signals at the LPF output. Such parasitic AM results in growth of out-of-band spectrum components after combining signals y1 and y2. In general, the perfect signal reconstruction after combining signals passed through LPFs becomes difficult.

However for many commercial available (low-mid cost LSI) DACs, such the assumption is not applicable. Normally, the DACs have low-pass filter (LPF) at its output. Such the LPFs introduce some parasitic amplitude modulation (AM) into the DAC output signal. With such the parasitic AM and non-linear HPA, the complete signal reconstruction may not be possible. Thus the out-of-band spectrum components are arising in the HPA output signal spectrum.

One of the aims of the present invention is to provide a modulator that removes parasitic amplitude modulation automatically, thereby reconstructing a signal inputted into the modulator at an output terminal of the LINC modulator.

Another of the aims of the present invention is to provide am amplifier having a modulator that removes parasitic amplitude modulation automatically, thereby reconstructing a signal inputted into the modulator at an output terminal of the LINC modulator.

SUMMARY

A linear amplification with nonlinear components (LINC) modulator is provided. The LINC modulator includes: a separator that generates a plurality of constant envelope signals (x1($t$), x2($t$)) from a source signal (x(t)); a processor that receives an input signal (x1($t$), x2($t$)) and detects and removes a phase jump in phase trajectory of the input signal (x1($t$), x2($t$)) to generate a first signal having a continuous phase trajectory and a second signal having a discontinuous phase trajectory; and a quadrature modulator that mixes the first signal with the second signal to reconstruct the input signal (x1($t$), x2($t$)).

The object and advantages of the invention will be realized and attained by means of the elements and combinations particularly pointed out in the claims.

It is to be understood that both the foregoing general description and the following detailed description are exemplary and explanatory and are not restricted of the invention, as claimed.

BRIEF DESCRIPTION OF DRAWINGS

FIG. 4 is a diagram illustrating the spectrums for signal in the C-HPA arms at the LPFs outputs;

FIG. 6 is a functional diagram illustrating an amplifier having a narrowband non-linear constant envelope modulator according to a first embodiment of the present invention;

FIG. 10 is a diagram illustrating a waveform of the in-phase component of the two-tone signal;

FIG. 11 is a diagram illustrating a waveform of the quadrature-phase component of the two-tone signal;

FIG. 14 is a diagram illustrating a waveform of the in-phase component of the two-tone signal with (dotted line) and without (solid line) removed phase manipulation;

FIG. 15 is a diagram illustrating a waveform of the quadrature-phase component of the two-tone signal with (dotted line) and without (solid line) removed phase manipulation;

FIG. 23 is a functional diagram illustrating an amplifier having the LINC modulator, the LINC modulator being illustrated in FIG. 20;

FIG. 24 is a diagram illustrating spectrum of the output signal from a conventional LINC modulator and the modulator having a LPF with pass-band 40 MHz.

DESCRIPTION OF EMBODIMENTS

Figure 1:
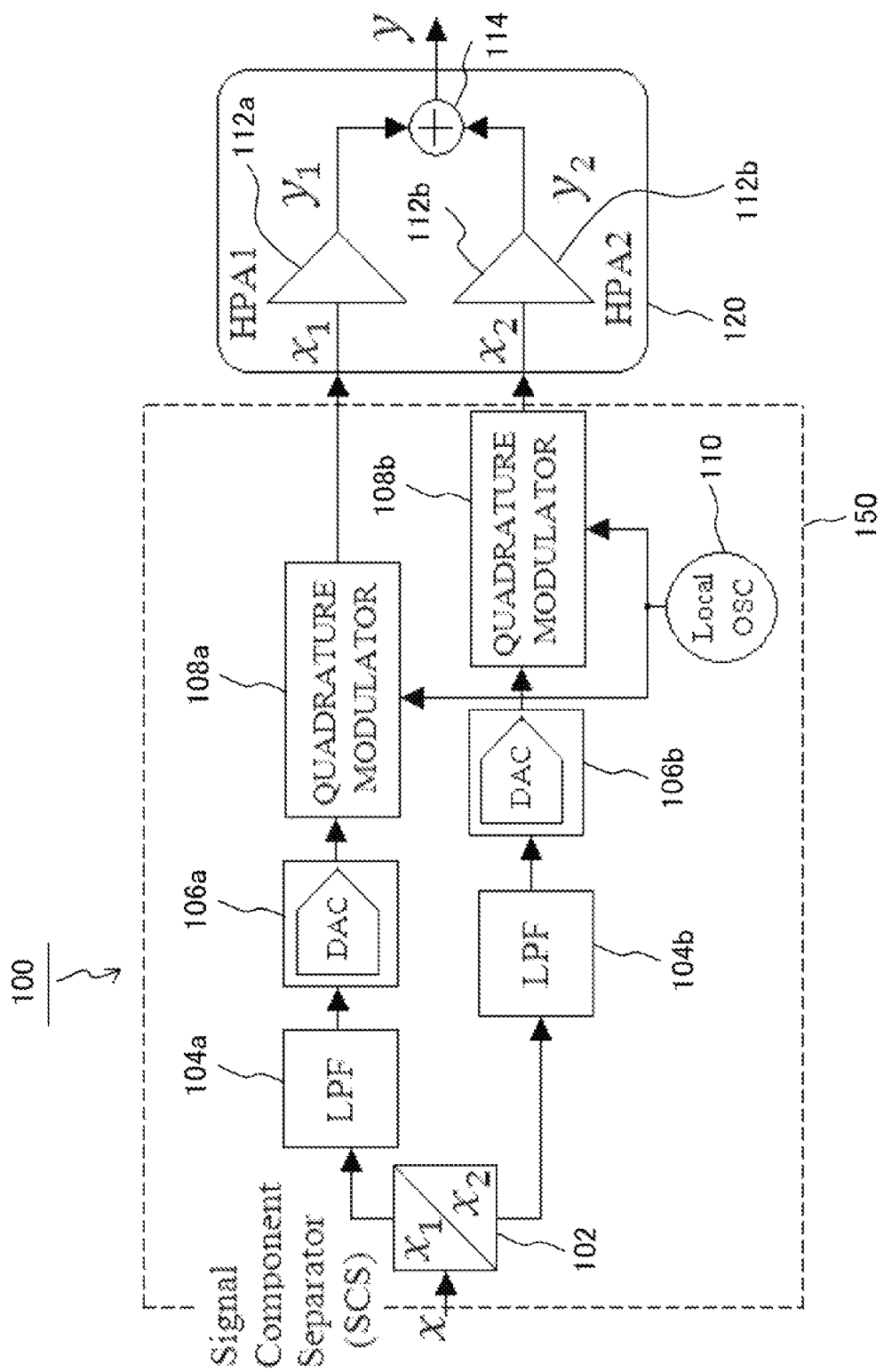
FIG. 1 is a functional diagram illustrating an exemplary composite High Power Amplifier (C-HPA) with the frequency restriction in the C-HPA arms and combined output from the individual HPAs.

With referring to the drawings, the detailed description of the present invention will be provided. In the drawings, like numerals may describe similar components in different views. Like numerals having different letter suffixes may represent different instances of similar components. The drawings illustrate generally, by the way of example, but not by the way of limitation, various embodiments discussed in the present document.

COMPARATIVE EXAMPLE

At first, comparative example of composite High Power Amplifier (C-HPA) will be explained to make understanding of technical features of the preferred embodiments according to the present invention easier.

FIG. 1 is a functional diagram illustrating an example of composite High Power Amplifier (C-HPA) 100. The C-HPA 100 may be suffered from the frequency restriction in each of the C-HPA arms and generate an output signal y(t) that is obtained in the manner in which signals from the individual high power amplifiers (HPAs) are combined.

The C-HPA 100 illustrated in FIG. 1 includes several components of a high frequency circuit. The components includes a signal component separator (SCS) 102, two low pass filters (LPFs) (sometimes simply referred to as a filter) 104a and 104b, two digital-to-analog convertors (DACs) 106a and 106b, two quadrature modulators (or sometimes referred to as two quadrature modulators for simplicity) 108a and 108b, a local oscillator 110, a first high power amplifier (HPA1) 112a, a second high power amplifier (HPA2) 112b, and combiner 114. The SCS 102, the LPFs 104a, 104b, the DACs 106a, 106b, the quadrature modulators 108a, 108b, and the local oscillator 110 constitutes a LInear amplification using Nonlinear Components (LINC) modulator 150.

The SCS 102 generates two constant-envelope signals, i.e., a first constant-envelope signal x1(t) and a second constant-envelope signal x2(t) using a source signal x(t), i.e., a baseband source signal x(t). In other words, the source signal x(t) is separated into the two constant envelope signals x1(t) and x2(t) by the SCS 102. If the source signal x(t) may be written as $$x(t) = c(t)e^{\sqrt{-1}\phi(t)}, 0 \le c(t) \le c_{max}. \quad (1)$$

Wherein two constant envelope signals x1(t) and x2(t) may be calculated as $$x_1(t) = \frac{x(t)}{2}(1 - e(t)) = \frac{1}{2}c_m \cos[\varphi(t) - \Psi(t)], \quad (2)$$

$$x_2(t) = \frac{x(t)}{2}(1 + e(t)) = \frac{1}{2}c_m \cos[\varphi(t) + \Psi(t)], \quad (3)$$

where $$\Psi(t) = \cos^{-1}[c(t)/c_m],$$

and e(t) is a signal that is in quadrature to the source signal x(t):

$$e(t) = \sqrt{-1}\, x(t) \times \sqrt{\frac{c_{max}^2}{|c(t)|^2} - 1}. \quad (4)$$

Thus, x(t)=x1(t)+x2(t) and |x1(t)|=|x2(t)|, where |x| represents an absolute value of x. It should be noted that x1(t) and x2(t) have constant amplitudes that are time-independent, while the source signal x(t) has a time-dependent amplitude.

Figure 2:
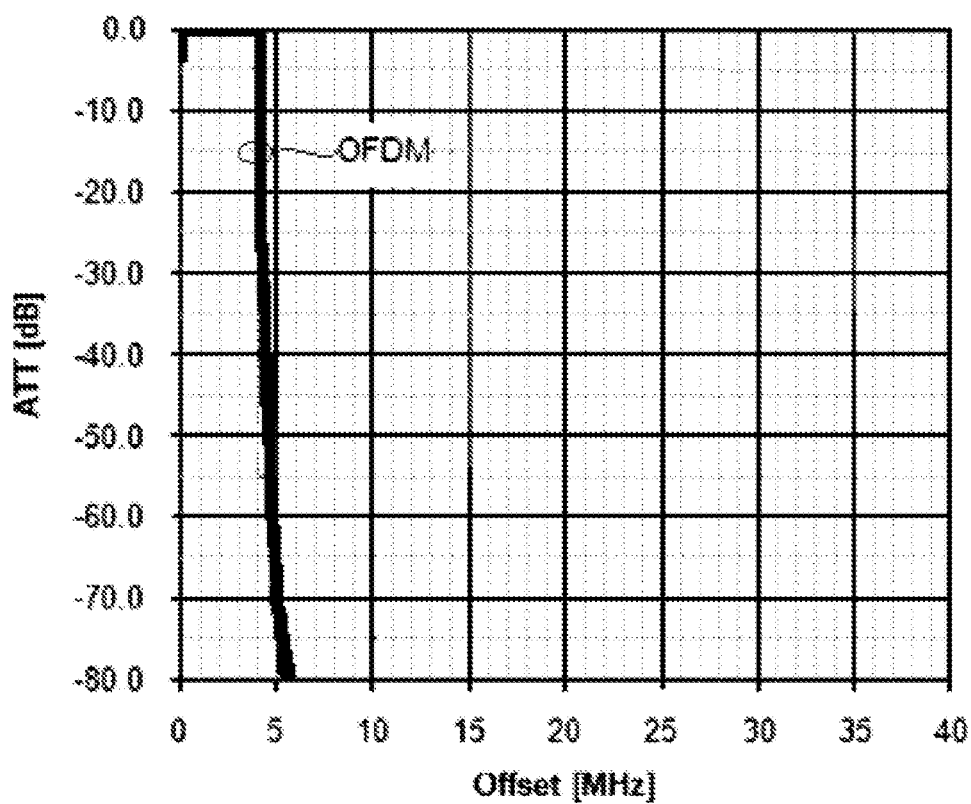
FIG. 2 is a diagram illustrating the spectrum of an input signal x(t) of C-HPA.
Figure 3:
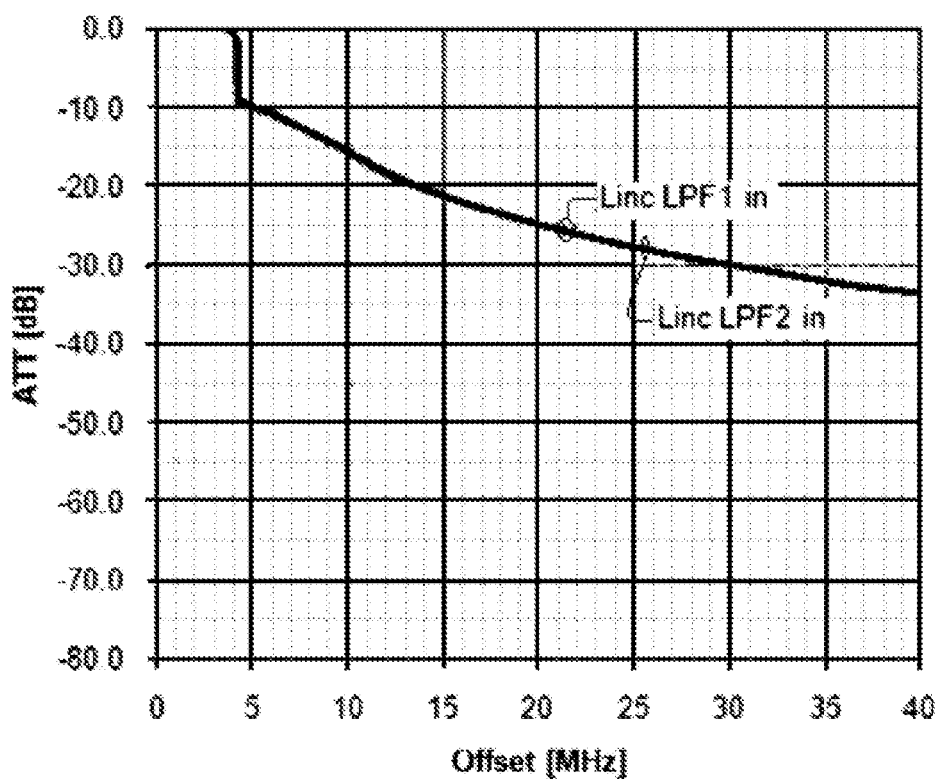
FIG. 3 is a diagram illustrating the spectrums signals in the C-HPA arms (x1 and x2) after signal component separator.

FIG. 2 illustrates the spectrum of the source signal x(t) in equation (1). It may be seen that the source signal x(t) has a narrow spectrum. However, the signal component separating operation causes a significant spectrum expansion for signals x1(t) and x2(t) at as illustrated in FIG. 3.

The LPFs 104a and 104b remove frequency components higher than a predetermined sampling frequency and noise components from each of output signals x1(t) and x2(t) from the SCS 102, respectively. In other words, the LPFs 104a and 104b pass frequency components lower then the predetermined frequency only.

Spectrums for signals at the LPF output (or what is the same at the inputs of the HPA1 112a and the HPA2 112b) are illustrated in FIG. 4, illustrating a fact that LPFs 104a and 104b may remove frequency components higher than 10 MHz from the output signals x1(t) and x2(t) from the SCS 102. The high frequency part that cut by LPF causes the unwanted parasitic AM modulation in signals at the output terminal of LPF 104a, 104b.

The DACs 106a and 106b convert output signals from the LPF 104a and the LPF 104b from a digital to analog signal, respectively.

The local oscillator 110 is an oscillation circuit such as a frequency combiner or the like employing a voltage controlled oscillator that may be controlled by a phase-locked loop (PLL). The local oscillator 110 outputs a local oscillation signal to the quadrature modulators 108a and 108b.

The quadrature modulator 108a includes mixer for frequency-converting (up-converting) frequencies and mixing the output signal from the DAC 106a with the local oscillation signal from the local oscillator 110. Thus, the quadrature modulator 108a serves as a multiplier that multiples input signals to generate an output signal. After mixing, the quadrature modulator 108a up-converts the output signal from the DAC 106a to predetermined frequency. Ideally, the quadrature modulator 108a generates and outputs the constant envelope signal x1(t).

The quadrature modulator 108b has the similar configuration and function with the quadrature modulator 108a. Ideally, the quadrature modulator 108b generates and outputs the constant envelope signal x2(t).

The first high power amplifier (HPA1) 112a amplifies the output signal from the quadrature modulator 108a and outputs an amplified signal to the combiner 114. Similarly, the second high power amplifier (HPA2) 112b amplifies the output signal from the quadrature modulator 108b and outputs an amplified signal to the combiner 114.

The quadrature modulator 108a, 108b of each arm may be characterized by a level-dependent complex gain G. Thus, output signals y1(t) and y2(t) should be given by $$y_1(t) = x_1(t) \cdot G_1(|x_1(t)|), \quad (5)$$

$$y_2(t) = x_2(t) \cdot G_2(|x_2(t)|). \quad (6)$$

The combiner 114 combines the input signals thereto, in this case the signals from the HPA1 112a and HPA2 112b to generate an output signal y(t) from the amplifier 100. In this case, the output signal y(t) becomes $$y(t) = y_1(t) + y_2(t) = \quad (7)$$
$$x(t)\frac{G_1(|x_1(t)|) + G_2(|x_1(t)|)}{2} + e(t)\frac{G_1(|x_1(t)|) - G_2(|x_1(t)|)}{2}.$$

The second term in (7) implies that there in an unwanted residual signal when the gain and phase matching are not perfected, i.e., imperfect cancellation is occurred. This term leads to limit the spectrum efficiency due to interfering power in the adjacent arms.

Figure 5:
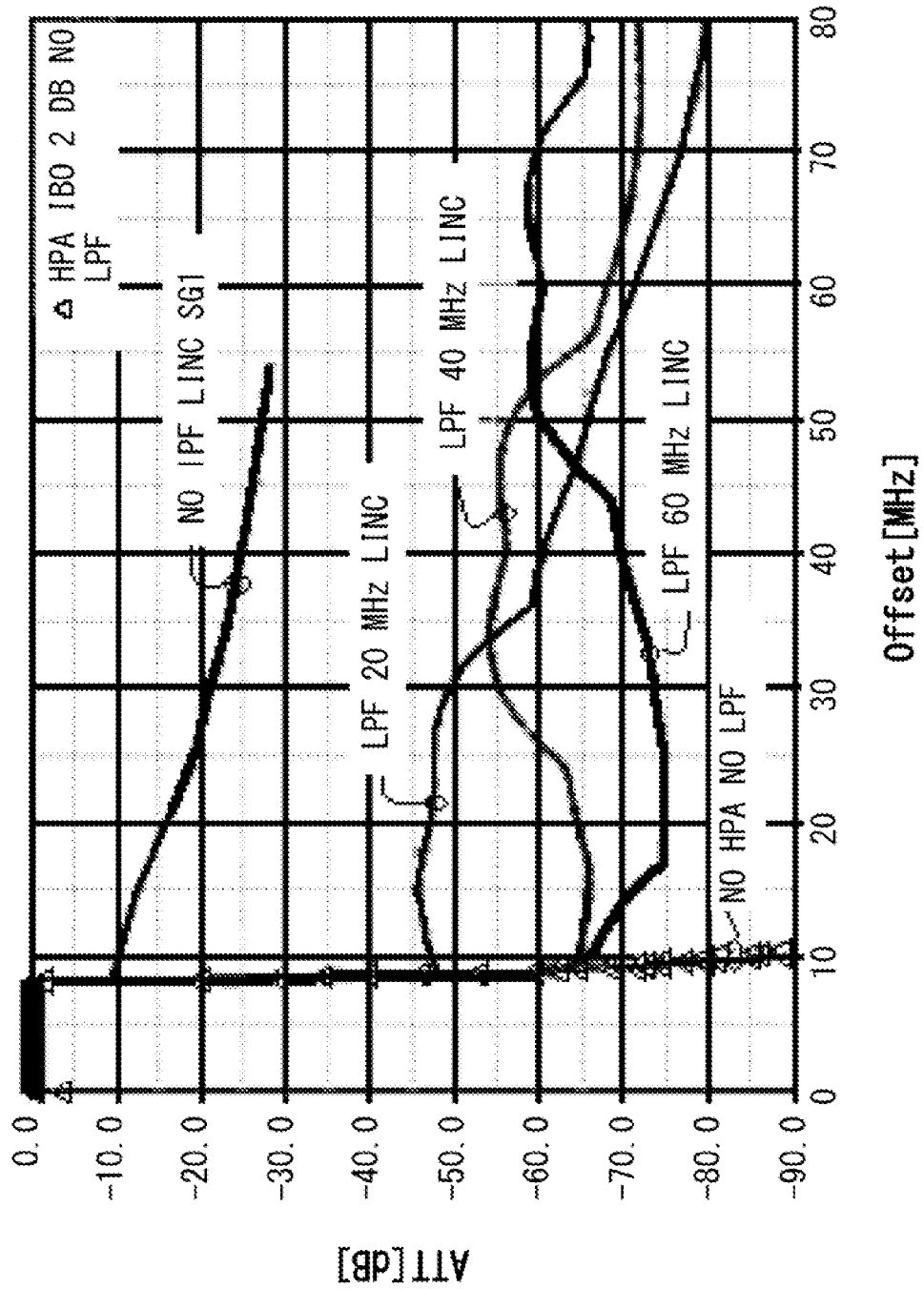
FIG. 5 is a diagram illustrating the C-HPA output signal spectrum (spectrum for signal y) for LPFs in the arms with passband 20 MHz, 40 MHz and 60 MHz.

It may be occurred that the parasitic amplitude modulation (AM) results in growth of out-of-band spectrum components after combining signals y1 and y2. FIG. 5 illustrates the spectrums of the LINC HPA output signal for 10 MHz orthogonal frequency-division multiplexing (OFDM) signal x(t). As may be found from FIG. 5, the LINC C-HPA signal after combining has a higher level of the out-of-band spectrum components compared with the original signal x(t).

First Embodiment

Referring to FIGS. 6-18, a first embodiment of an amplifier (or a composite high power amplifier (C-HPA)) 200 having a linear amplification using nonlinear components (LINC) modulator 250 will be explained.

The LINC modulators disclosed in this specification have a function of removing out-of-band spectrum components at the modulator output after combining signals y1 and y2. The function of removing out-of-band spectrum components may be operated based on the signal spectrum narrowing by means of the additional baseband phase control for signals in the C-HPA arms. Such the out-of-band spectral components are caused by the parasitic amplitude modulation at the input terminals of high power amplifier, for example, HPA1 112a and HPA2 112b in FIG. 1.

It is known fact that a signal bandwidth depends on the order of continuous derivative of the phase. Thus, in order to make the spectrum more compact, it may be efficient to remove phase discontinuities from the signal.

Figure 7:
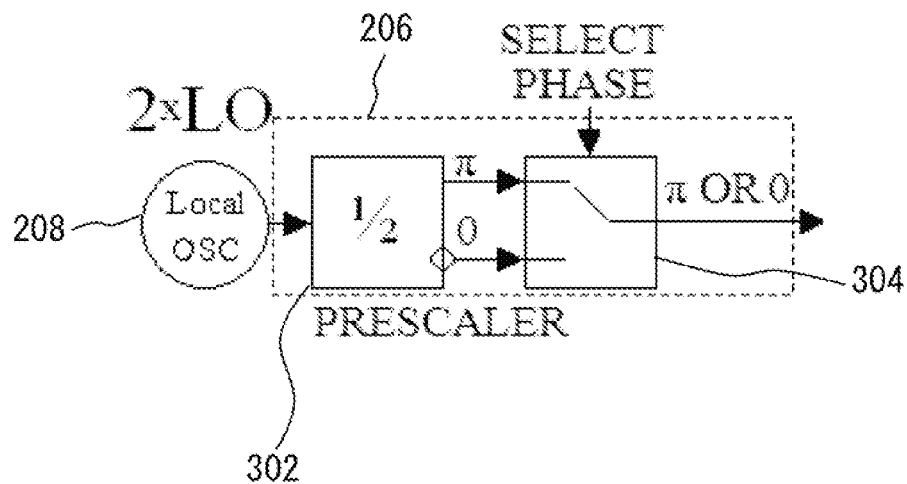
FIG. 7 is a functional diagram illustrating the local oscillator phase manipulator.

FIG. 6 is a functional diagram illustrating an amplifier 200 having a LINC modulator 250 according to a first embodiment of the present invention, and FIG. 7 is a functional diagram illustrating the first phase manipulator 206a in FIG. 6.

The amplifier 200 is designed to reduce the bandwidth requirements for the circuits in the C-HPA arms. The digital-to-analog convertor (DAC) circuit requirements also may be relaxed. Thus, the conversion speed (clock) and the resolution requirements (bit resolutions) for the DACs in the C-HPA arms may be reduced sequentially. Therefore the low-cost DACs may be implemented in the LINC C-HPA instead of costly high grade LSIs. At the same time, the level of the out-of-the band spectrum at the C-HPA output after combining is maintained low. Thus the proposed invention may provide the perfect reconstruction signal at the C-HPA output in the case of the frequency restriction in the arms.

One of the arm of the C-HPA 200 (in the followings, sometimes referred to as a first arm) includes a first processor 202a for removing an exceed phase modulation, e.g., a phase having an amplitude of n, low pass filter (LPF) 104a, a first digital-to-analog convertor (DAC) 106a, a quadrature modulator 108a, a phase selector 204, a first phase manipulator 206a, a local oscillator 208, a first high power amplifier 112a (HPA1), and adder 114. Similarly, another of the arm of the C-HPA 200 (in the followings, sometimes referred to as a second arm) includes a second processor 202b for removing an exceed phase modulation, e.g., a phase having an amplitude of n, LPFs 104b, a first digital-to-analog convertor (DAC) 106b, a quadrature modulator 108b, phase selector 204, a second phase manipulator 206b, a local oscillator 208, a first high power amplifier 112b (HPA2), and adder 114. However, the first and second arms include the separator 102.

The LINC modulator 250 includes a separator 102, the first and second processors 202a and 202b, the LPFs 104a and 104b, the DACs 106a and 106b, the quadrature modulators 108a and 108b, the phase selector 204, the first and second phase manipulators 206a and 206b, and local oscillator 208.

The first and second processors 202a and 202b receive the first and second constant envelope signal x1($t$) and x2($t$) from the SCS 102 and remove an exceed phase modulation for $\pm\pi$ from the first and second constant envelope signals x1($t$) and x2($t$) to generate output signals. That is, the first and second processors 202a and 202b may determine the phase trajectories of the input signals x1($t$) and x2($t$) to detect the phase jump, e.g., the exceed phase modulation for $\pm\pi$. The output signals from the first and second processors 202a and 202b are inputted into the LPFs 104a and 104b, respectively. The output signals from the processors 202a, 202b are characterized as having a continuous phase trajectory.

The phase selector 204 informs the first phase manipulator 206a whether frequency components of $+\pi$ or $-\pi$ should be generated.

The first phase manipulator 206a and the second phase manipulator 206b generate signals for reconstructing the first constant-envelope signal x1($t$) at the quadrature modulator 108a and the second constant-envelope signal x2($t$) at the quadrature modulator 108b. Specifically, the first phase manipulator 206a outputs the signal having the phase $\pm\pi$. to compensate the exceed phase manipulation removed at the first processor 202a based on output signals from the local oscillator 208 and the phase selector 204. In the similar way, the second phase manipulator 206b outputs the signal having the phase $\pm\pi$ to compensate the exceed phase manipulation removed at the second processor 202b based on output signals from the local oscillator 208 and the phase selector 204.

The local oscillator 208 has the same or the similar function with that of the local oscillator 110.

FIG. 7 is a functional diagram illustrating the first phase manipulator 206a that generates a signal having frequency components of $+\pi$ or $-\pi$. As illustrated in FIG. 7, the first phase manipulator 206a includes a prescaler 302 and selector 304. The prescaler 302 transforms the input signal from the local oscillator 208 to signals having phase of $\pi$ and 0. These signals are inputted into the selector 304. The selector outputs one of the input signals from the prescaler 302.

Figure 8:
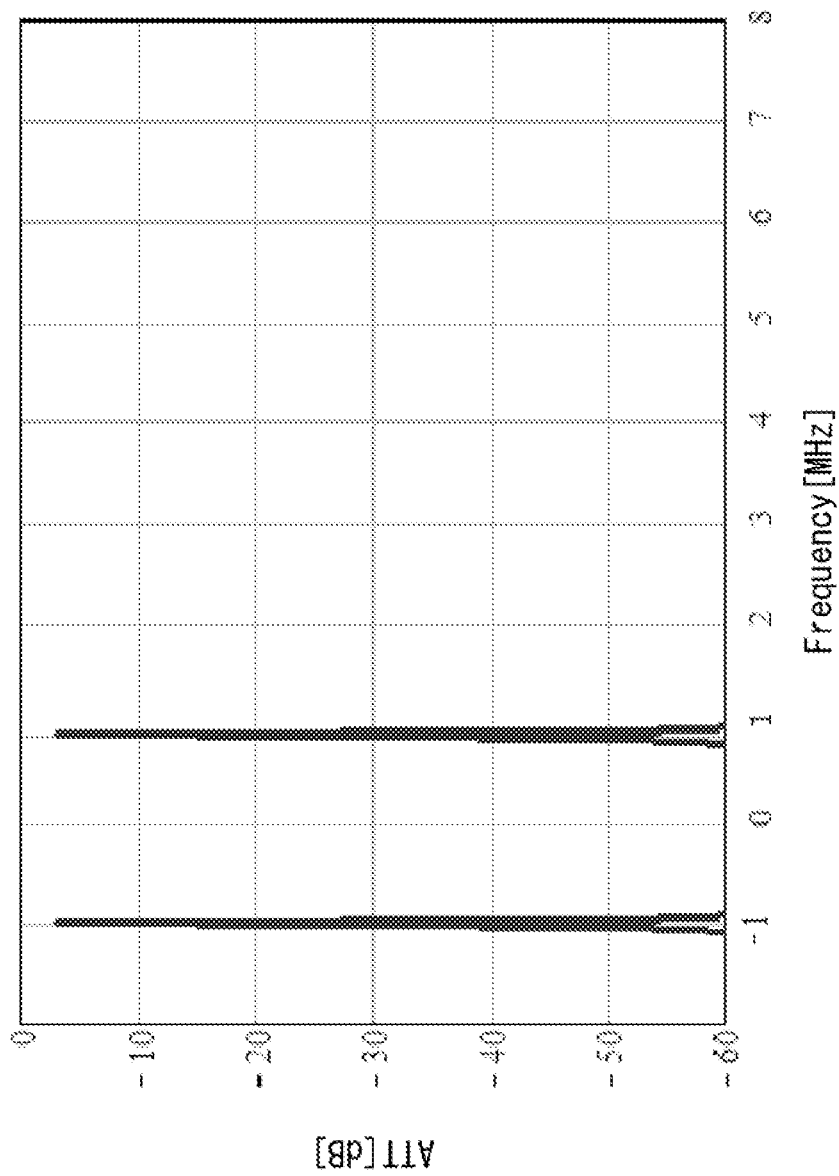
FIG. 8 is a diagram illustrating the spectrum of two-tone 1 MHz C-HPA input signal.

FIG. 8 is a diagram illustrating the spectrum of two-tone 1 MHz C-HPA input signal x(t). It may be seen that the input signal x has only a narrow peak of its spectrum. The source signal x(t) represents a first constant-envelope signal x1($t$) and a second constant-envelope signal x2($t$).

Figure 9:
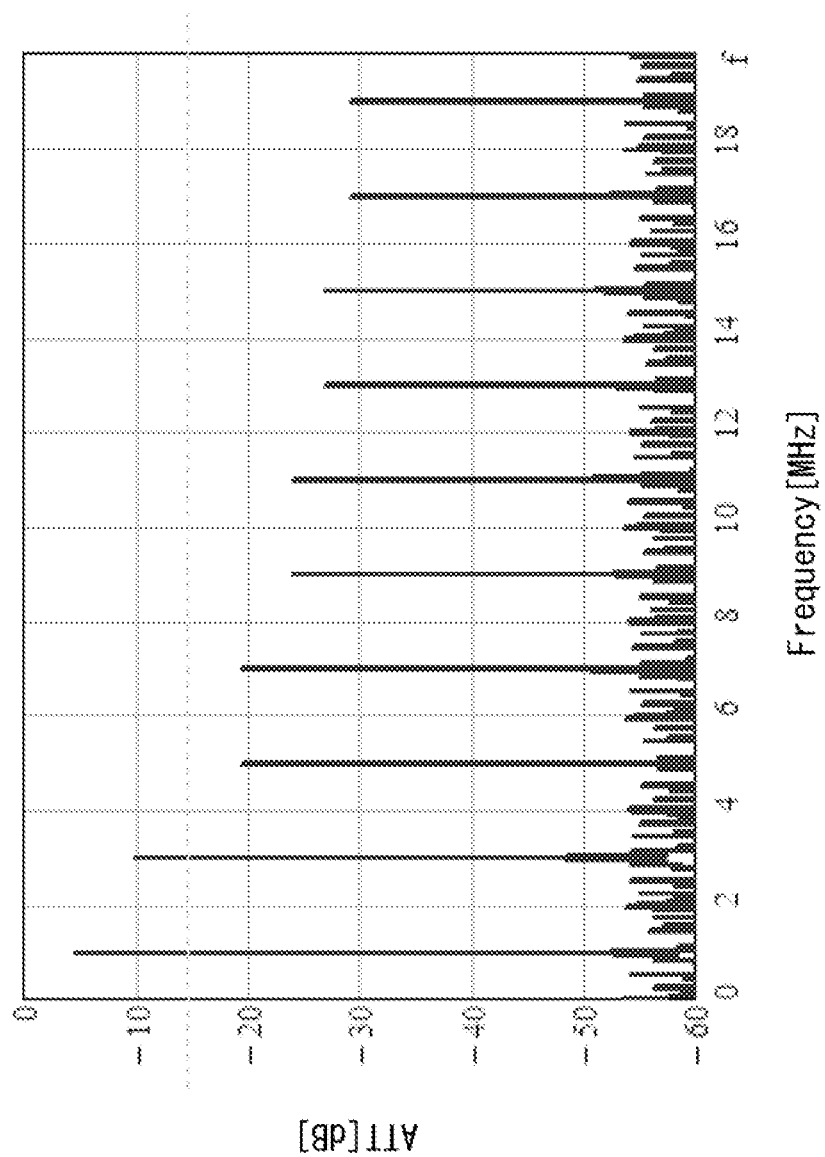
FIG. 9 is a diagram illustrating the spectrum of two-tone signal after passing through a signal component separator (SCS)

FIG. 9 is a diagram illustrating the spectrum of two-tone signal after passing through a signal component separator (SCS). It may be seen that signals x1($t$) and x2($t$) have significantly wider spectrum than the original signal x(t).

FIGS. 10 and 11 illustrate the in-phase and quadrature waveforms for signals x1($t$) and x2($t$). The quadrature signal waveform illustrated in FIG. 11 has a waveform discontinuous due to phase jumps on $\pm\pi$. Such $\pm\pi$phase jumps are responsible for the x1($t$) and x2($t$) signals spectrum widening. In the followings, we will refer such phase jumps as a exceed phase manipulation.

Figure 12:
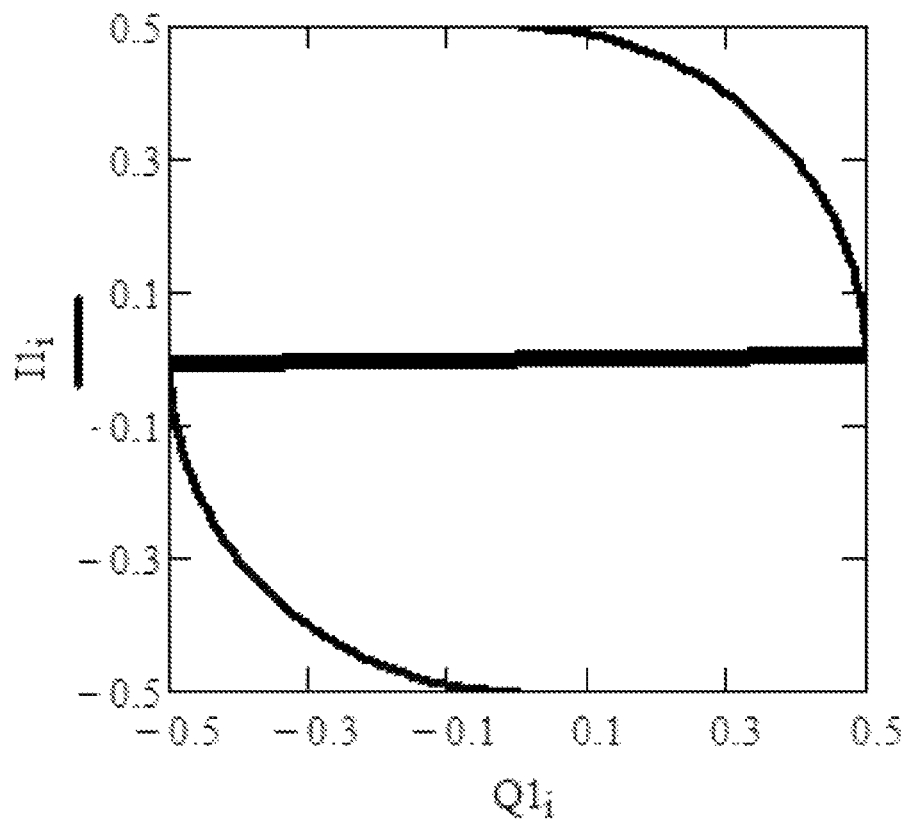
FIG. 12 is a diagram illustrating the phase trajectories for two tone signal at the SCS block output.

FIG. 12 is a diagram illustrating the phase trajectories for two tone signal x at the signal component separator (SCS) block output, and FIG. 10 is a diagram illustrating the corresponding spectrums for two tone signal at the output terminal of the SCS block, i.e., i.e. signals x1($t$) and x2($t$).

As may be seen from FIG. 12, the phase trajectory for signals in the C-HPA arms has a phase jump (discontinues) for $\pm\pi$. Such phase discontinue causes the signal spectrum expansion at the SCS output as it illustrated in FIG. 13. Such phase jumps for $\pm\pi$ are responsible for the x1($t$) and x2($t$) signals spectrum widening.

Figure 17:
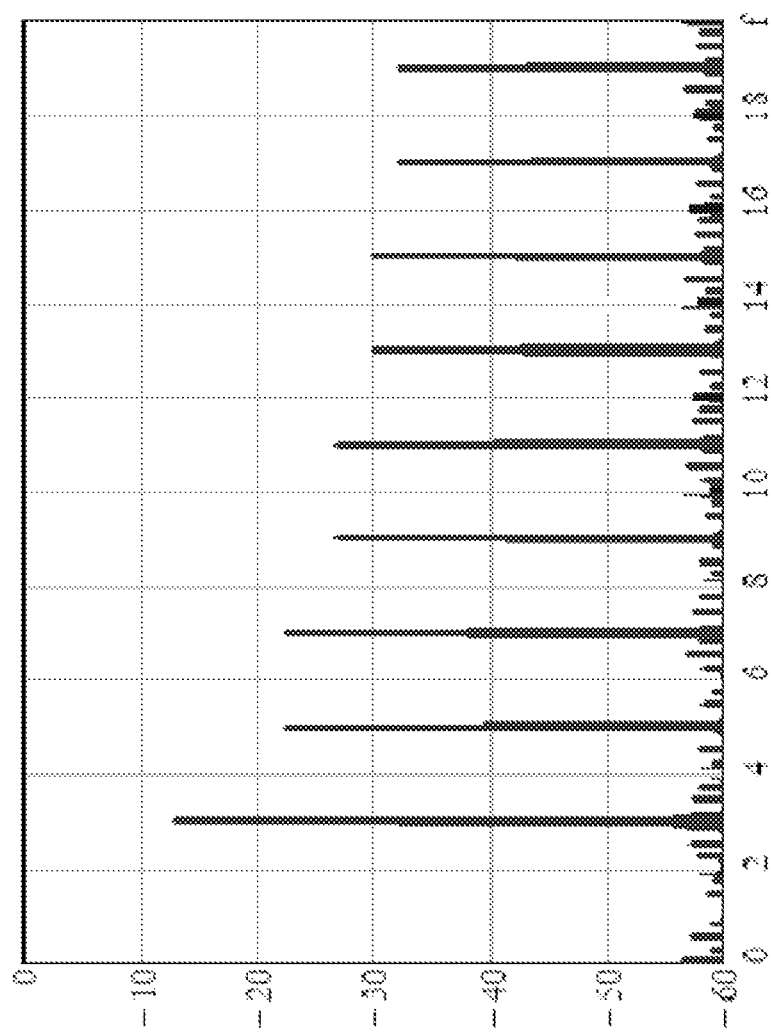
FIG. 17 is a diagram illustrating the two tone signal at the SCS block output before exceed phase manipulation for ±π has been removed from signals x1 and x2.
Figure 18:
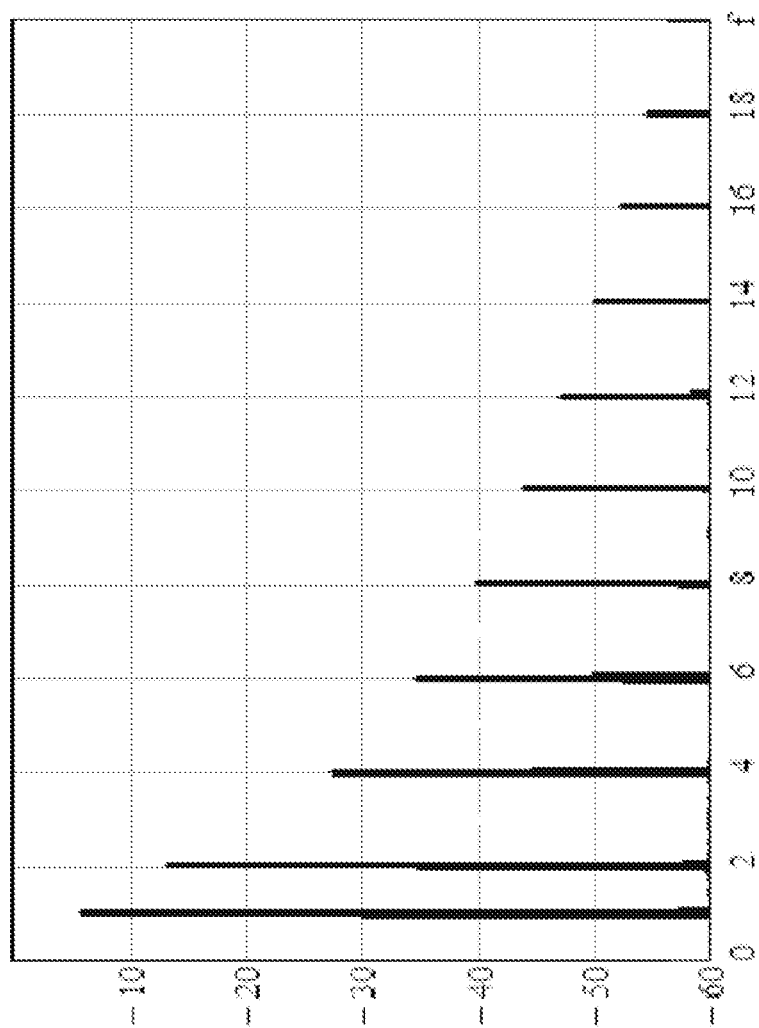
FIG. 18 is a diagram illustrating the two tone signal at the SCS block output after exceed phase manipulation for ±π has been removed from signals x1 and x2.

In order to avoid spectrum widening, in the present embodiment, we remove the exceed $\pm\pi$ phase manipulation from the signals x1($t$) and x2($t$). FIGS. 14 and 15 show waveforms for the signals x1($t$) and x2($t$) before (solid line) and after (dotted line) removing $\pm\pi$ phase manipulation. FIGS. 17 and 18 illustrate the spectrum for the signals x1($t$) and x2($t$) with and without exceed phase manipulation, respectively. As may be find from FIGS. 17 and 18, the spectrum for the proposed system (the blue plot) has more compact shape.

The first constant-envelope signal x1($t$) may be inputted into the first processor 202a. In the followings, detailed description of operation of the second arms would be omitted because of the analogy of that of the first arm.

Figure 16:
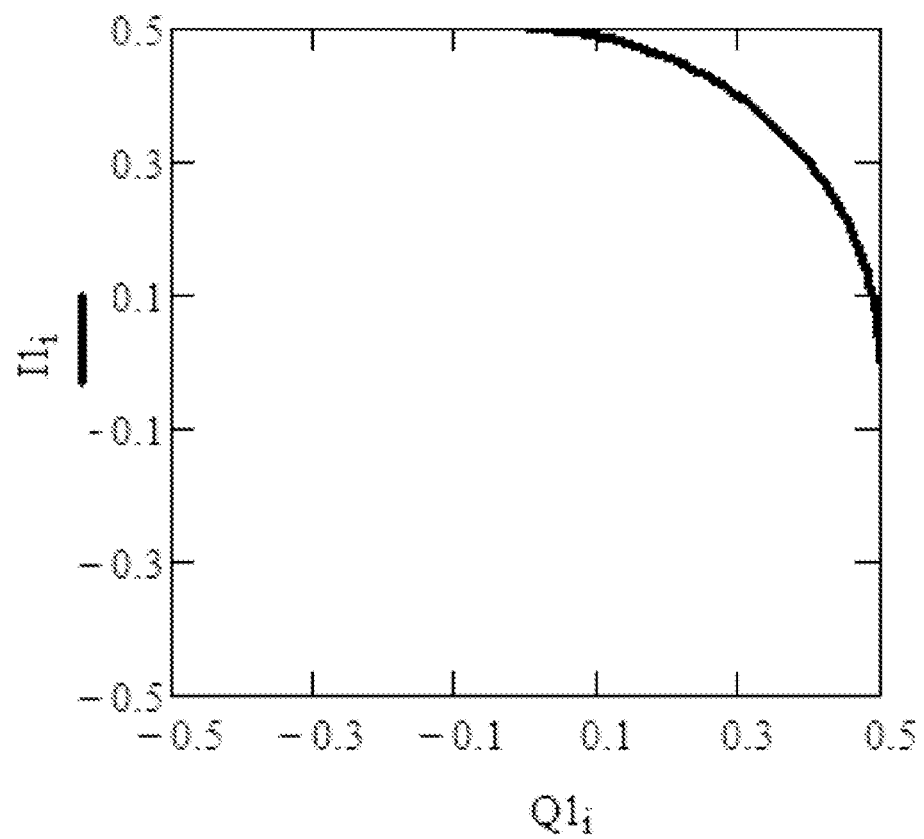
FIG. 16 is a diagram illustrating the phase trajectories for two tone signal at the SCS block output after exceed phase manipulation for ±π has been removed from signals x1 and x2.

FIG. 16 is a diagram illustrating the two tone signal at the SCS block output after exceed phase manipulation for $\pm\pi$ has been removed from signals x1($t$) and x2($t$), and FIG. 12 is a functional diagram illustrating a narrowband non-linear constant envelope modulator according to this embodiment of the present invention. The information about the removed component is sent to the phase selector 204. This information will be used to generate a signal for compensating the removed component at the quadrature modulator 108a. The resulting signal that does not include a phase of $\pm\pi$ is inputted into the quadrature modulator 108a after passing through the LPF 104a and the DAC 106a. The functions of the LPF 104a and the DAC 106a may be the same or similar to those of LPF 104 and DAC 106 illustrated in FIG. 1, respectively. The removed components of the first constant-envelope signal x1($t$) at the first processor 202a should be compensated before the first constant-envelope signal x1($t$) is inputted into the HPA1. Thus, at the quadratic modulator 108a, the original signal x1 may be reconstructed.

Figure 13:
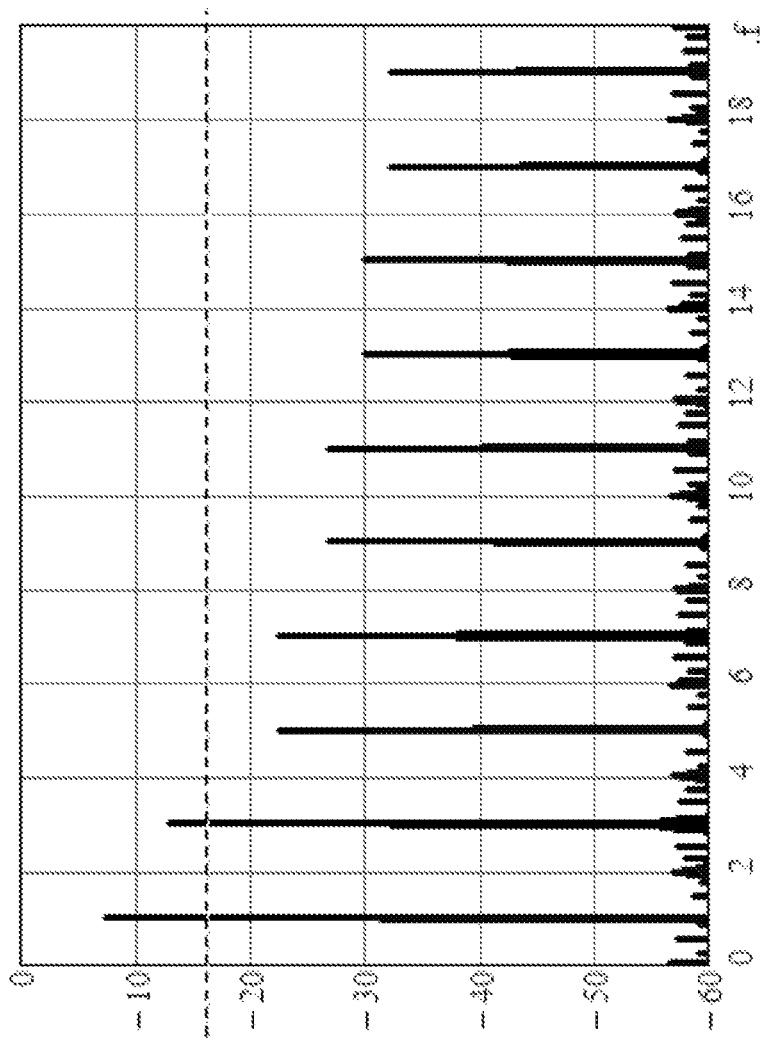
FIG. 13 is a diagram illustrating the spectrums for two tone signal at the SCS block output.

FIG. 13 is a diagram illustrating the spectrums for two tone signal at the SCS block output, and FIG. 17 is a diagram illustrating the phase trajectories for two tone signal at the SCS block output after exceed phase manipulation for ±π has been removed from signals x1 and x2.

The configuration of the amplifier (or a composite high power amplifier (C-HPA)) 200 having the LINC modulator 250 mentioned above allows to reduce the bandwidth requirements for the circuits in the C-HPA arms. Especially, the DACs requirements for operatic clock frequency may be relaxed. Thus, it may become possible to implement DACs with low or middle conversion speed (conversion clock) for generation of the signals x1 and x2 in the C-HPA arms. Therefore the low-cost DACs may be implemented in the LINC C-HPA instead of costly hi-grade LSIs. At the same time, the level of the out-of-the band spectrum at the C-HPA output after combining is keeping low.

Further, according to such the configuration of the amplifier 200 having the LINC modulator 250, the method for amplifying the source signal may be functioned. The method for amplifying a source signal (x(t)) includes: generating a plurality of constant envelope signals from a source signal by SCS 102; receiving the corresponding one of the plurality of the constant envelope signal (x1($t$), x2($t$)); detecting phase jumps in phase trajectories of the plurality of the constant envelope signals (x1($t$), x2($t$)) at the processors 402$a$, 402$b$; removing the phase jumps to generate first signals having a continuous phase trajectory and second signals having a discontinuous phase trajectory; mixing each of the first signals with a corresponding one of the second signals to reconstruct the input signals (x1($t$), x2($t$)) in the processors 402$a$, 402$b$; amplifying the reconstructed input signals (x1($t$), x2($t$)) to generate amplified signals (y1($t$), y2($t$)) by HPA1 112$a$, HPA2 112$b$; and adding all of the amplified signals (y1($t$), y2($t$)) using adder 114.

Therefore, the modulator 200 allows to use a narrowband circuit in a composite high amplifier arm, e.g., digital-to-analog convertor (DAC) with low clock frequencies, the narrowband circuit having cost advantages and preventing from regrowth of the out-of-band spectral component.

The LINC modulator may use a narrowband circuit in a composite high amplifier arm, e.g., digital-to-analog convertor (DAC) with low clock frequencies to remove parasitic amplitude modulation automatically, thereby reconstructing a signal inputted into the modulator at an output terminal of the LINC modulator.

Second Embodiment

Figure 19:
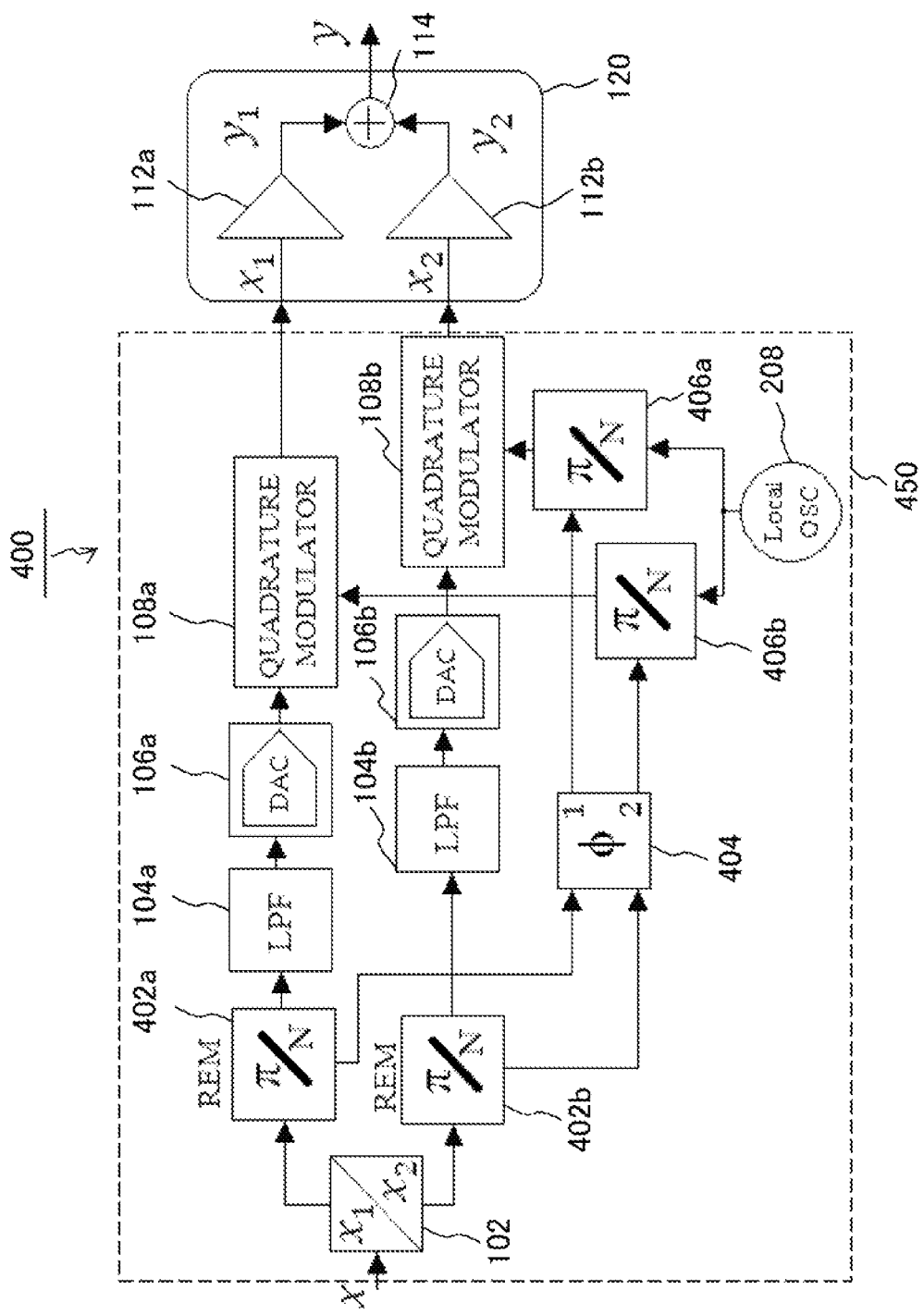
FIG. 19 is a functional diagram illustrating an amplifier having a LINC modulator according to a second embodiment of the present invention.

Referring to FIG. 19, a second embodiment of an amplifier 400 having the LINC modulator 450 will be explained.

In this embodiment, the spectrums for signals in the arms may be made more narrow if, in addition to ±π phase manipulation, exclude the exceed phase manipulations for ±π/2, ±π/4, . . . , ±π/N. Of course in this case it is preferable to provide the ability for local oscillator (LO) phase manipulation for ±π/2, ±π/4, . . . , ±π/N. Such the narrowband non-linear constant envelope modulator with ±π/N exceed phase modulation removing describes for the general case is illustrated in FIG. 19.

Similar to the amplifier 200 illustrated in FIG. 6, one of the arm of the C-HPA (sometimes referred to as amplifier for simplicity) 400 (in the followings, sometimes referred to as a first arm) includes a first processor 402$a$ for removing an exceed phase modulation, e.g., a phase having an amplitude of n/N, the low pass filter (LPF) 104$a$, the first digital-to-analog convertor (DAC) 106$a$, the quadrature modulator 108$a$, a phase selector 404, a first phase manipulator 406$a$, the local oscillator 208, the first high power amplifier 112$a$ (HPA1), and adder 114, where N is an integer. Similarly, another of the arm of the C-HPA 400 (in the followings, sometimes referred to as a second arm) includes a second processor 202$b$ for removing an exceed phase modulation, e.g., a phase having an amplitude of π/N, the LPFs 104$b$, a second digital-to-analog convertor (DAC) 106$b$, the quadrature modulator 108$a$, a phase selector 404, a first phase manipulator 406$b$, the local oscillator 208, the first high power amplifier 112$b$ (HPA2), and adder 114.

The LINC modulator 450 includes the first and second processors 402$a$ and 402$b$, the LPFs 104$a$ and 104$b$, the DACs 106$a$ and 106$b$, the quadrature modulators 108$a$ and 108$b$, the phase selector 404, the first and second phase manipulators 406$a$ and 406$b$, and the local oscillator 208.

The first and second processors 402$a$ and 402$b$ receive the first and second constant envelope signal x1($t$) and x2($t$) and remove an exceed phase modulation for ±π/N from the first and second constant envelope signal x1($t$) and x2($t$) to generate output signals, where N is an integer. It is also possible that the first and second processors 402$a$ and 402$b$ remove a plurality of exceed phase modulations, for example for ±π/N, ±π/2N, ±π/3N, . . . .

The configurations and functions of the phase selector 404, and the first phase manipulator 406$a$ and the second phase manipulator 406$b$ may be obtained straightforwardly from those of the phase selector 204, and the first phase manipulator 206$a$ and the second phase manipulator 206$b$ illustrated in FIG. 6 by changing the value of the exceed phase modulation.

The configuration of the narrowband non-linear LINC modulator (or a composite high power amplifier (C-HPA)) 400 has the same effects and advantages of that of the narrowband non-linear LINC modulator 200.

Third Embodiment

Referring to FIGS. 20-25, a third embodiment of the present invention configured to implement such the phase smoothing method will be explained.

The amplifier 200 and 400 having the LINC modulator 250 and 450, respectively, according to the previous embodiments remove only discrete phase jumps, i.e., exceed phase manipulation. For large N, such exceed phase manipulation removing is equivalent to smoothing phases for signals x1 and x2 in the C-HPA arms.

Thus, there is a possibility for making spectrum for signals x1 and x2 in the C-HPA arms narrow with smoothing its phase trajectories.

Before describing the detailed description of the present embodiment, the basic operations of a modulator according to the present embodiment will be explained below.

Figure 20:
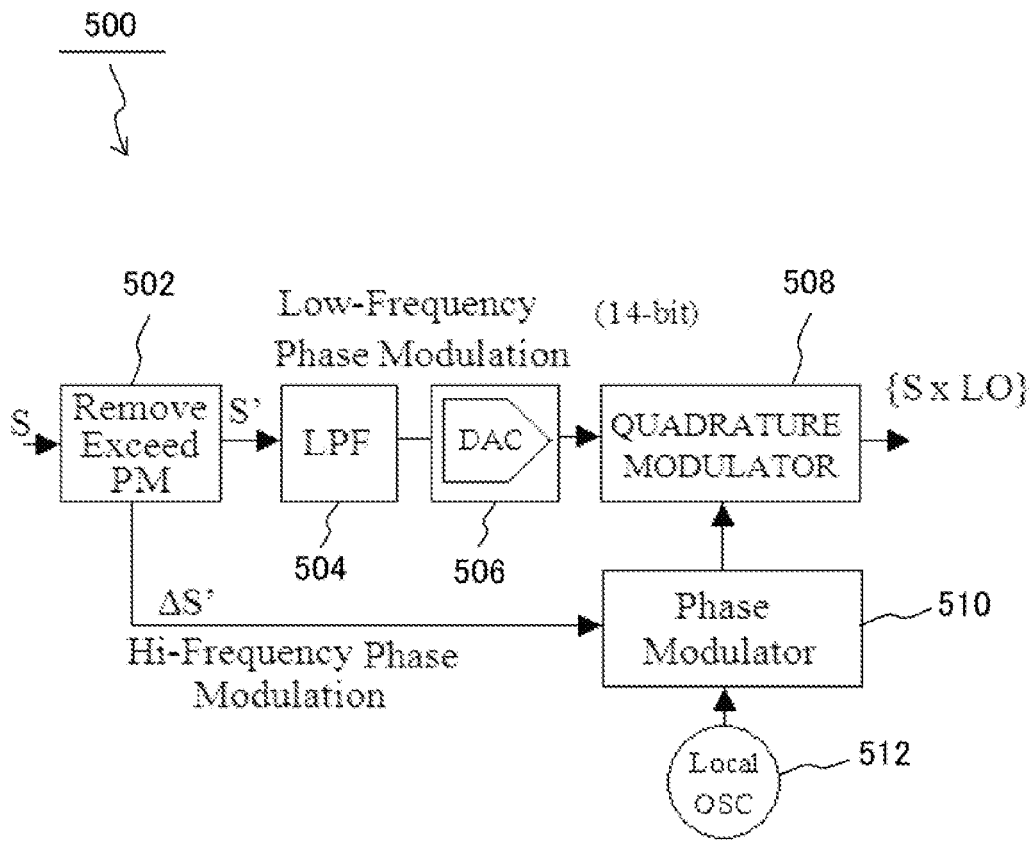
FIG. 20 is a functional diagram illustrating an arm of a LINC modulator according to a third embodiment of the present invention.

FIG. 20 is a functional diagram illustrating an arm 500 of a LINC modulator 750 of an amplifier 700 according to a third embodiment of the present invention.

As illustrated in FIG. 20, the arm 500 of the amplifier 700 includes a processor 502 for removing exceed phase modulation. That is, the signal passing through the paths of the modulator 750 has a bandwidth narrower than that of the input signals (x1($t$), x2($t$)). That is, the phase jump removed from in phase trajectory of the input signals (x1($t$), x2($t$)) is generated by subtracting a phase of a signal passed through a Gaussian filter from the phase of the input signal (x1($t$), x2($t$)) in this embodiment.

Figure 21:
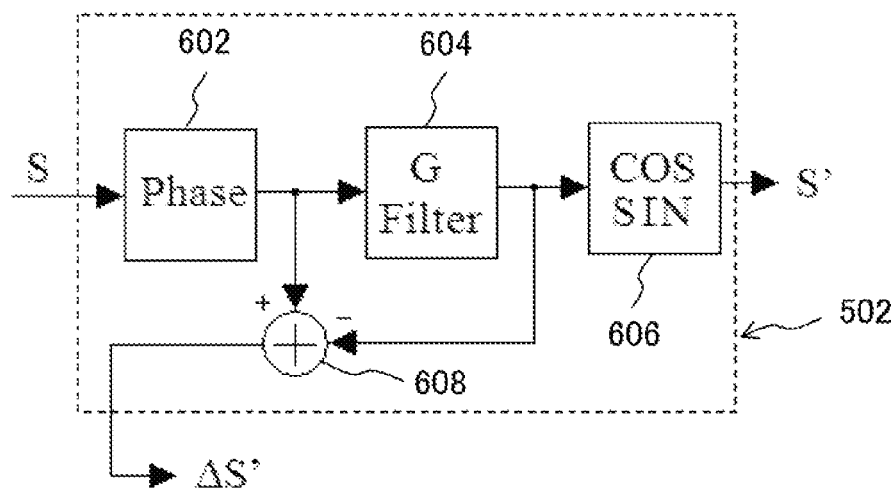
FIG. 21 is a functional diagram illustrating a processor for removing the exceed phase modulation in FIG. 15.

FIG. 21 is a functional diagram illustrating a processor 502 for removing the exceed phase modulation. The processor 502 includes phase detector 602, a Gaussian filter 604, a transformer 606, and a subtractor 608.

The phase detector 602 detects phase of the input signal S.

The Gaussian filter 604 may be considered as a generalization of the processors 202a, 202b, 402a, 402b to alternate one which remove discrete phase jumps $\pm\pi/N$ or $\pm m\pi/N$, where N a sufficiently large integer value and m is an integer. This G-filter is similar to the filter that used in the GSM modulation. Generally speaking it may be any filter that able to smooth the input signal phase enough.

The transformer 606 transforms the output signal from the Gaussian filter 604 that belongs to the frequency domain to a signal having the time domain waveform S'. In general, the time domain waveform S' may be expressed as a sum of cosine and/or sine waves.

As illustrated in FIG. 21, the input signal S is entered into a phase detector 602. The information about the phase of the input signal S would be utilized to generate a signal having discrete phase $\Delta S$ at a subtractor 608. The discrete phase $\Delta S$ is defined as a phase difference $\Delta S=\text{phase}\{S\}-\text{phase}\{S'\}$ between the original S signal phase and signal with the phase smoothed in the Gaussian filer S'.

Figure 22:
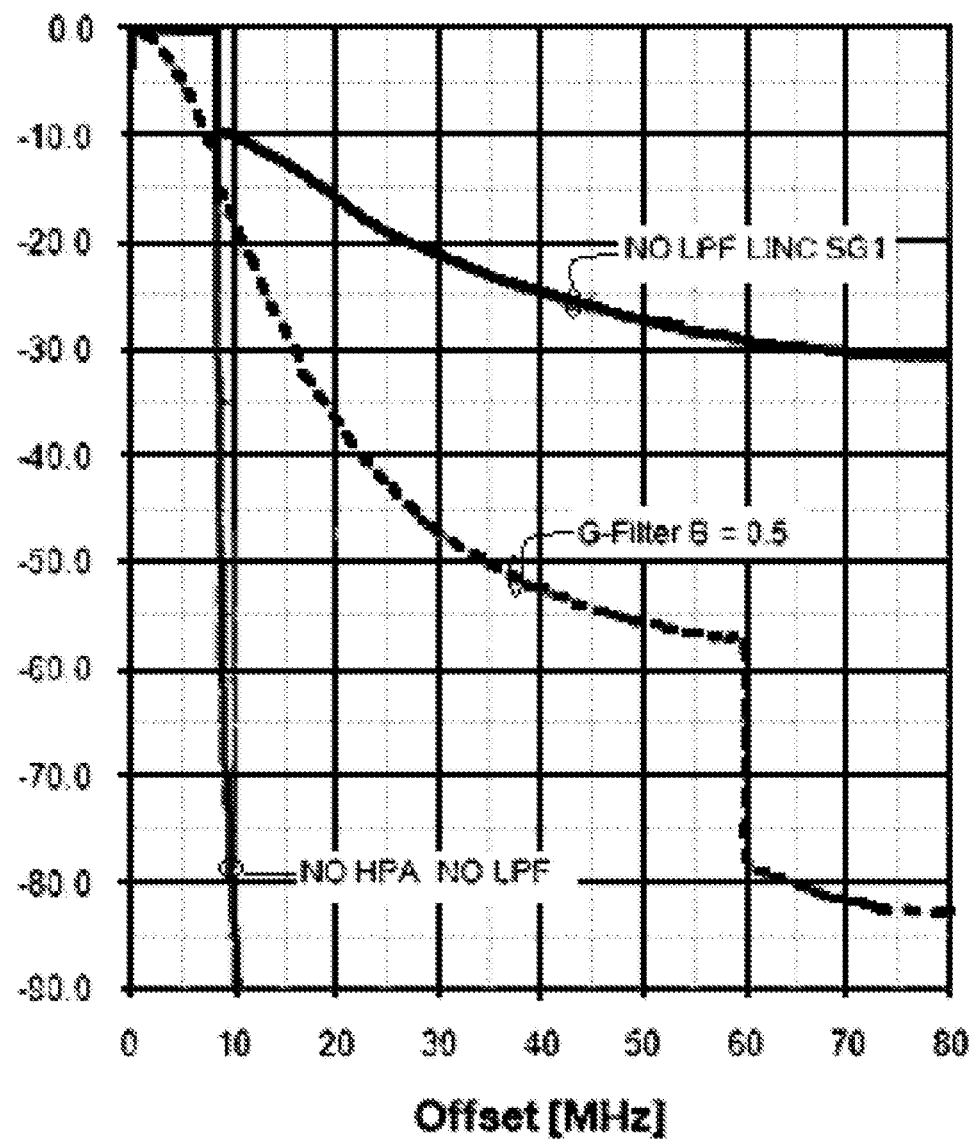
FIG. 22 is a diagram illustrating signal spectrum before and after phase smoothing with Gaussian filter.

The signal output from the transformer 606 has very compact i.e. narrowband spectrum because the exceed phase discontinues have been removed by the Gaussian filter (hereinafter sometimes referred to as a G-filter) 604. FIG. 22 illustrates signal spectrum at the input terminal of the processor 502, i.e., the spectrum for signal S (NO HPA NO LPF) and signal spectrum of the output S' (dashed line). As may be found from FIG. 22, the signal spectrum at the output terminal of the Gaussian filter 604 has very compact shape. The spectrum of the Gaussian filtered signal S' is narrowband, therefore the LPF 504 at the output terminal of the DAC 506 may not cause any strong frequency distortion of the signal S. This is because the output signal S of the Gaussian filter 604 is matched with the LPF pass-band. Therefore the signal envelope in the input terminal of the quadrature modulator 508 is substantially the constant. In FIG. 22, show spectrum for the original signals (NO LPF LINC SG1) and signal at the output terminal of the Gaussian filter 604.

FIG. 23 is a functional diagram illustrating a C-HPA 700 having a LINC modulator 750 utilizing a mechanism discussed with reference with FIGS. 21 and 22.

The narrowband non-linear constant envelope modulator 700 has an architecture which is constructed by two arms, each of the arms having a structure illustrated in FIG. 20.

One of the arms of the C-HPA 700 (in the followings, sometimes referred to as a first arm) includes the signal component separator (SCS) 102, a first processor 702a, low pass filter (LPF) 104a, a quadrature modulator 108a, a first phase modulator 704a, a local oscillator 208, a first high power amplifier 112a (HPA1), and adder 114. Similarly, another of the arms of the narrowband non-linear LINC modulator 700 (in the followings, sometimes referred to as a second arm) includes the SCS 102, a second processor 702b, LPFs 104b, a quadrature modulator 108a, a second phase modulator 704b, a local oscillator 208, a second high power amplifier 112b (HPA2), and adder 114.

The LINC modulator 750 includes the separator 102, the first and second processors 702a and 702b, the LPFs 104a and 104b, the DACs 106a and 106b, the quadrature modulators 108a and 108b, the first and second phase modulator 704a and 704b, and the local oscillator 208.

The first and second processors 702a and 702b receive the first and second constant envelope signals x1(t) and x2(t) from the SCS 102 and output the smoothed narrowband signal to the LPFs 104a and 104b and signals having discrete phases $\Delta S1'$ and $\Delta S2'$ to the first and second phase modulators 704a and 704b.

The first phase modulator 704a and the second phase modulator 704b generate signals for reconstructing the first constant-envelope signal x1(t) at the quadrature modulator 108a and the second constant-envelope signal x2(t) at the quadrature modulator 108b. Specifically, the first phase modulator 704a outputs the signal having the discrete phase $\Delta S1'$ to compensate the removed components at the first processor 202a. In the similar way, the second phase modulator 704b outputs the signal having the discrete phase $\Delta S2'$ to compensate the removed components at the first processor 704b.

The removed components of the first constant-envelope signal x1(t) at the first processor 702a should be compensated before the first constant-envelope signal x1(t) is inputted into the HPA1 112a. Thus, at the quadratic modulator 108a, the original signal x1 may be reconstructed. Similarly, at the quadratic modulator 108b, the original signal x2 may be reconstructed.

As may be seen in FIG. 23, the phase difference $\Delta S=\text{phase}\{S\}-\text{phase}\{S'\}$ between the phases of the original signal S and the signal with the smoothed phase S' in Gaussian filter 604 is used for additional local oscillator (LO) modulation phase in order to restore the original signals x1(t) and x2(t) at the quadrature modulator 508, or what is the same, at input terminals of the individual HPAs 112a, 112b. Because of such architecture, the influence of the LPFs 104a, 104b on the out-of-band spectrum level may be reduced significantly.

Figure 25:
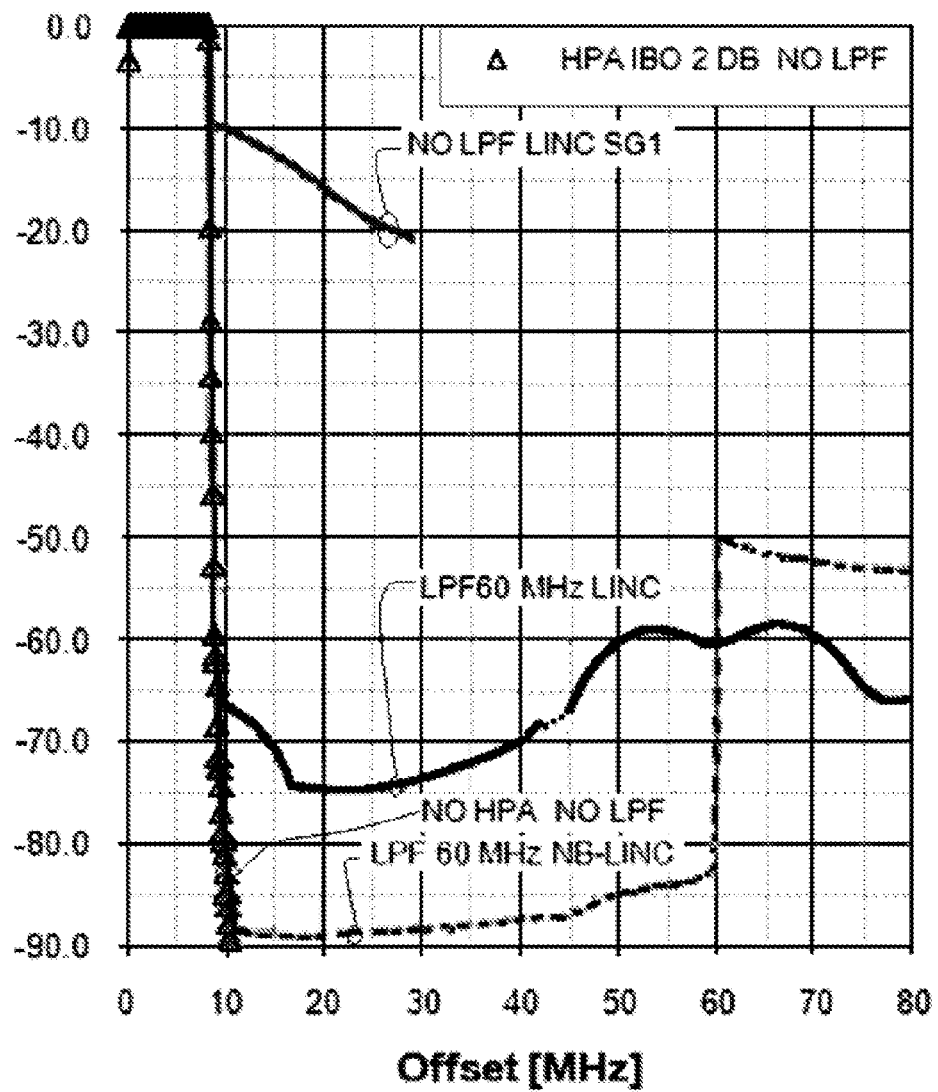
FIG. 25 is a diagram illustrating spectrum of the output signal from a conventional LINC modulator and the modulator having a LPF with pass-band 60 MHz.

FIG. 24 is a diagram illustrating spectrum of the output signal from a conventional LINC modulator and the modulator 700 having a LPF 104a, 104b with pass-band 40 MHz, and FIG. 25 is a diagram illustrating spectrum of the output signal from a conventional LINC modulator and the modulator 700 having LPFs 104a, 104b with pass-band 60 MHz.

The modulator with block-diagram illustrated in FIG. 23 has been used during the simulations. Two LPF with pass-band 40 and 60 MHz have been used for signals in the arms spectrum restriction. The spectrum for LINC modulator illustrated in FIG. 1 is denoted in FIGS. 24 and 25 as "LINC".

As may be found from the FIGS. 24 and 25, the proposed approach provides better signal reconstruction at the C-HPA output. Thus the level of the out-of-band emission, due to the proposed modulator implementation, may be reduced up to 20-25 dB in the most restricted near spectrum area.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made thereto without departing from the spirit and scope of the invention.

What is claimed is:

1. A linear amplification with nonlinear components (LINC) modulator, comprising:
   a separator that generates a plurality of constant envelope signals from a source signal;
   a processor that receives an input signal and detects and removes a phase jump in phase trajectory of the input signal to generate a first signal having a continuous phase trajectory and a second signal having a discontinuous phase trajectory; and a quadrature modulator that mixes the first signal with the second signal to reconstruct the input signal).

2. The modulator according to claim 1, wherein the processor) removes the phase jump of $\pi/(m\ N)$, where m and N are integers.

3. The LINC modulator according to claim 1, wherein the phase jump removed from in phase trajectory of the input signal is generated by subtracting a phase of a signal passed through a Gaussian filter from the phase of the input signal.

4. The LINC modulator according to claim 2, further comprising:

a digital-to-analog convertor that is passed by the first signal after being outputted from the separator and before inputting the multiplier, the first digital-to-analog converter having bandwidth narrower than that of the input signal.

5. An amplifier, comprising a separator that generates a plurality of constant envelope signals from a source signal;

a plurality of arms, each of the plurality of the arms being passed by a corresponding one of the plurality of the constant envelope signal to output a corresponding one of a plurality of input signals to be passed through a corresponding one of the plurality of the arms, and each of the plurality of the arms comprising:

a processor that receives the corresponding one of the plurality of the constant envelope signal and detects and removes a phase jump in phase trajectory of the corresponding one of the plurality of the constant envelope signal to generate one of first signals having a continuous phase trajectory and one of second signals having a discontinuous phase trajectory; and a quadrature modulator that mixes the one of the first signals with the one of the second signals to reconstruct the plurality of constant envelope signals;

a plurality of power amplifier, each of the plurality of the power amplifier amplifying a corresponding one of the plurality of constant envelope signals to generate a amplified signal; and an adder that add all of the amplified signals.

6. The amplifier according to claim 5, wherein the processor removes the phase jump of $\pi/(m\ N)$, where m and N are integers.

7. The amplifier according to claim 5, wherein the phase jump removed from in phase trajectory of the plurality of constant envelope signals is generated by subtracting a phase of a signal passed through a Gaussian filter from the phase of the plurality of constant envelope signals.

8. The amplifier according to claim 6, further comprising:

a digital-to-analog convertor that is passed by the first signal after being outputted from the separator and before inputting the multiplier, the first digital-to-analog converter having bandwidth narrower than that of the plurality of constant envelope signals.

9. A method for amplifying an input signal, comprising generating a plurality of constant envelope signals from a source signal;

receiving the corresponding one of the plurality of the constant envelope signal;

detecting phase jumps in phase trajectories of the plurality of the constant envelope signals;

removing the phase jumps to generate first signals having a continuous phase trajectory and second signals having a discontinuous phase trajectory mixing each of the first signals with a corresponding one of the second signals to reconstruct the plurality of constant envelope signals;

amplifying the reconstructed constant envelope signals to generate amplified signals; and adding all of the amplified signals.

10. The method according to claim 9, wherein the processor removes the phase jump of $\pi/(m\ N)$, where m and N are integers.

11. The method according to claim 9, wherein the phase jump removed from in phase trajectory of the plurality of constant envelope signals is generated by subtracting a phase of a signal passed through a Gaussian filter from the phase of the plurality of constant envelope signals.

12. The method according to claim 10, further comprising:

converting the first signal before mixing each of the first signals with a corresponding one of the second signals to reconstruct the plurality of constant envelope signals.

* * * * *